US010157883B2

(12) United States Patent
Park et al.

(10) Patent No.: US 10,157,883 B2
(45) Date of Patent: Dec. 18, 2018

(54) SEMICONDUCTOR PACKAGE INCLUDING STEPWISE STACKED CHIPS

(71) Applicant: Samsung Electronics Co., Ltd., Suwon-si, Gyeonggi-do (KR)

(72) Inventors: Chul Park, Hwaseong-si (KR); Kilsoo Kim, Hwaseong-si (KR); In Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/404,090

(22) Filed: Jan. 11, 2017

(65) Prior Publication Data

US 2017/0125378 A1 May 4, 2017

Related U.S. Application Data

(63) Continuation of application No. 14/588,243, filed on Dec. 31, 2014, now Pat. No. 9,589,930.

(30) Foreign Application Priority Data

Jan. 16, 2014 (KR) .................. 10-2014-0005646

(51) Int. Cl.
*H01L 25/065* (2006.01)
*H01L 23/00* (2006.01)

(52) U.S. Cl.
CPC .......... *H01L 25/0652* (2013.01); *H01L 24/32* (2013.01); *H01L 24/48* (2013.01); *H01L 24/49* (2013.01); *H01L 24/73* (2013.01); *H01L 25/0657* (2013.01); *H01L 2224/05554* (2013.01); *H01L 2224/16225* (2013.01);

(Continued)

(58) Field of Classification Search
CPC ....... H01L 25/0657; H01L 2224/32145; H01L 2225/06562; H01L 25/0655; H01L 25/0652; H01L 2224/49175; H01L 2224/48137; H01L 24/05;

(Continued)

(56) References Cited

U.S. PATENT DOCUMENTS 5,373,189 A * 12/1994 Massit ................ H01L 25/0652
257/686
6,278,616 B1 * 8/2001 Gelsomini ............... G11C 5/04
257/686

(Continued)

FOREIGN PATENT DOCUMENTS

CN 101383333 A 3/2009
EP 2043152 A2 4/2009

(Continued)

*Primary Examiner* — Joshua King
(74) *Attorney, Agent, or Firm* — Renaissance IP Law Group LLP

(57) ABSTRACT

A semiconductor package comprises a package substrate; a first chip stack and a second chip stack mounted side by side on the package substrate, wherein the first and second chip stacks each include a plurality of semiconductor chips stacked on the package substrate, wherein each of the semiconductor chips includes a plurality of bonding pads provided on a respective edge region thereof, wherein at least some of the plurality of bonding pads are functional pads, and wherein the functional pads occupy a region that is substantially less than an entirety of the respective edge region.

14 Claims, 23 Drawing Sheets

(52) U.S. Cl.
CPC .............. *H01L 2224/32145* (2013.01); *H01L 2224/48091* (2013.01); *H01L 2224/48137* (2013.01); *H01L 2224/48139* (2013.01); *H01L 2224/48147* (2013.01); *H01L 2224/48225* (2013.01); *H01L 2224/48227* (2013.01); *H01L 2224/49175* (2013.01); *H01L 2224/73265* (2013.01); *H01L 2225/0651* (2013.01); *H01L 2225/06506* (2013.01); *H01L 2225/06558* (2013.01); *H01L 2225/06562* (2013.01); *H01L 2924/00014* (2013.01)

(58) Field of Classification Search
CPC . H01L 2224/06132; H01L 2224/06152; H01L 2224/09132; H01L 25/071; H01L 25/112
See application file for complete search history.

(56) References Cited

U.S. PATENT DOCUMENTS

| | | | |
|---|---|---|---|
| 6,359,340 B1 | 3/2002 | Lin et al. | |
| 6,376,904 B1 | 4/2002 | Haba et al. | |
| 7,612,436 B1* | 11/2009 | Lee | H01L 23/49503 257/672 |
| 7,952,183 B2 | 5/2011 | Okada et al. | |
| 7,989,959 B1 | 8/2011 | Rahman | |
| 8,030,747 B2 | 10/2011 | Lee et al. | |
| 8,525,349 B2 | 9/2013 | Song et al. | |
| 2004/0178502 A1* | 9/2004 | Ishikawa | H01L 23/49811 257/737 |
| 2007/0035002 A1* | 2/2007 | Moto | H01L 24/27 257/686 |
| 2007/0075414 A1* | 4/2007 | Tsutsumi | H01L 23/49838 257/692 |
| 2007/0194454 A1* | 8/2007 | Hanawa | G11C 5/06 257/777 |
| 2007/0262431 A1* | 11/2007 | Kuroda | H01L 24/06 257/678 |
| 2008/0150111 A1* | 6/2008 | Hiller | H01L 24/49 257/686 |
| 2009/0045527 A1* | 2/2009 | Tsai | H01L 23/49833 257/777 |
| 2009/0057902 A1* | 3/2009 | Chen | H01L 23/5286 257/741 |
| 2009/0108425 A1 | 4/2009 | Lee et al. | |
| 2009/0108470 A1 | 4/2009 | Okada et al. | |
| 2009/0152709 A1* | 6/2009 | Shinohara | H01L 23/49575 257/690 |
| 2009/0200680 A1* | 8/2009 | Shinohara | G11C 5/02 257/773 |
| 2009/0243064 A1* | 10/2009 | Camacho | H01L 23/3121 257/680 |
| 2009/0273096 A1* | 11/2009 | Hiew | H01L 21/565 257/777 |
| 2009/0294960 A1* | 12/2009 | Yoshida | H01L 23/50 257/737 |
| 2011/0037158 A1* | 2/2011 | Youn | H01L 23/50 257/686 |
| 2011/0084374 A1 | 4/2011 | Chen | |
| 2011/0089575 A1 | 4/2011 | Lee | |
| 2011/0266684 A1* | 11/2011 | Leal | H01L 21/56 257/773 |
| 2012/0080806 A1 | 4/2012 | Song et al. | |
| 2013/0049228 A1* | 2/2013 | Nam | H01L 24/97 257/777 |
| 2013/0168842 A1* | 7/2013 | Park | H01L 24/48 257/690 |
| 2014/0175673 A1* | 6/2014 | Kim | H01L 24/73 257/777 |
| 2015/0108663 A1* | 4/2015 | Hong | H01L 25/0657 257/777 |

FOREIGN PATENT DOCUMENTS

| | | | |
|---|---|---|---|
| JP | 2010258227 A | 11/2010 | |
| JP | WO 2011024851 A1 * | 3/2011 | ............ H01L 23/48 |
| KR | 20080084075 A | 9/2008 | |
| KR | 20090043898 A | 5/2009 | |
| KR | 20090113679 A | 11/2009 | |
| KR | 20110041301 A | 4/2011 | |
| KR | 20110123505 A | 11/2011 | |
| KR | 20110124061 A | 11/2011 | |
| KR | 20120035297 A | 4/2012 | |
| WO | 2011024851 A1 | 3/2011 | |

* cited by examiner

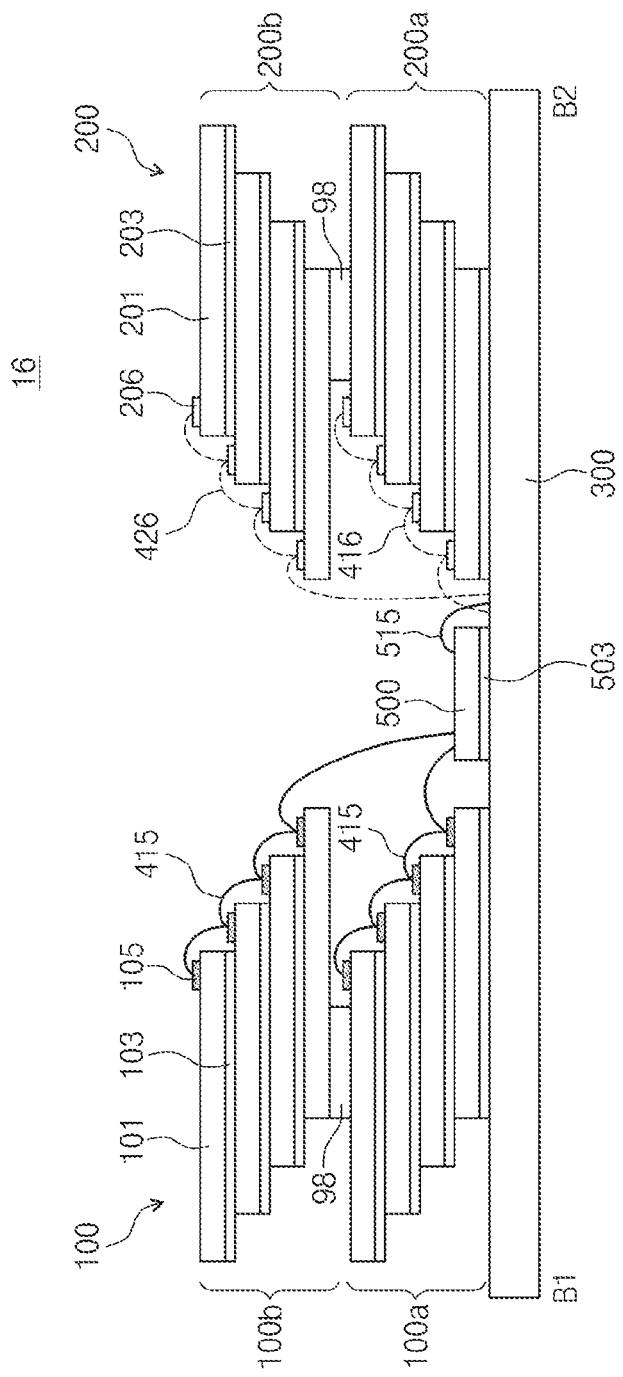

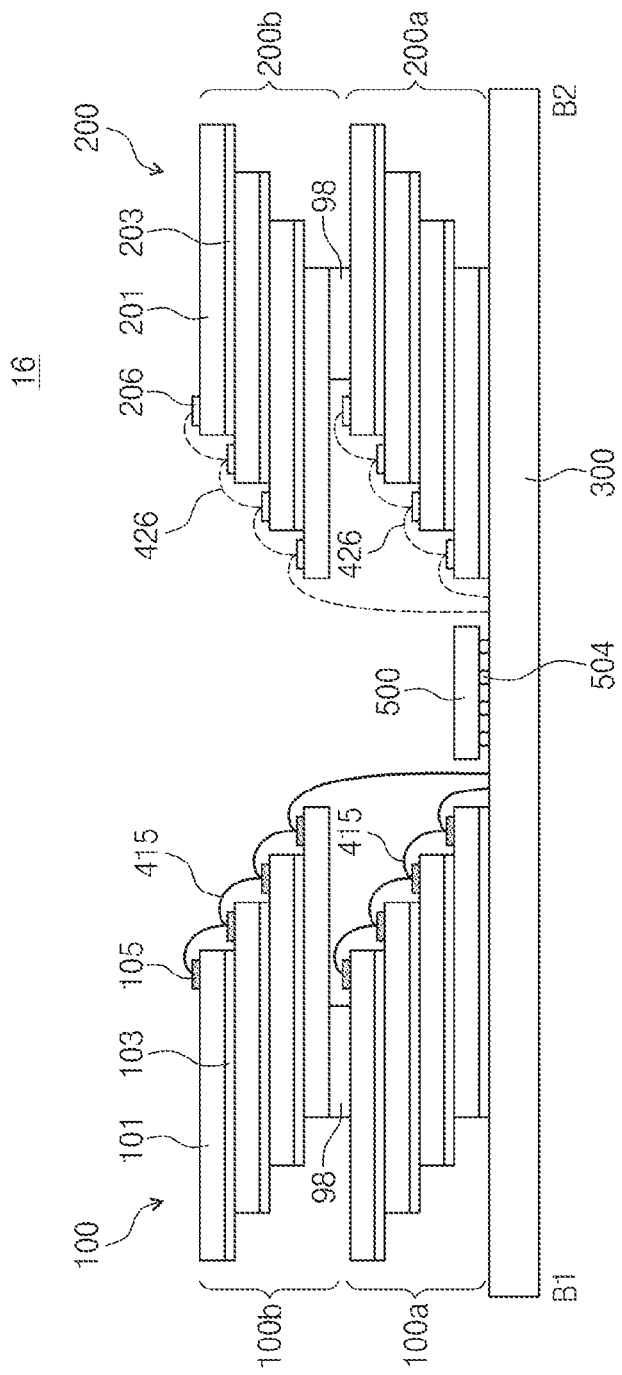

SEMICONDUCTOR PACKAGE INCLUDING STEPWISE STACKED CHIPS

CROSS-REFERENCE TO RELATED APPLICATIONS

This U.S. non-provisional patent application is a continuation of U.S. patent application Ser. No. 14/588,243, filed on Dec. 31, 2014, which claims priority under 35 U.S.C. § 119 to Korean Patent Application No. 10-2014-0005646, filed on Jan. 16, 2014, in the Korean Intellectual Property Office, the entire contents of which are hereby incorporated by reference.

BACKGROUND

Example embodiments of the inventive concept relate to a semiconductor device, and in particular, to a semiconductor package including stepwise-stacked chips.

In the semiconductor industry, various packaging technologies have been developed to meet the thriving demands for large storage capacity, thin, and small-sized semiconductor devices and/or electronic appliances. One approach has been a packaging technology through which semiconductor chips are vertically stacked to realize high-density chip stacking. This packaging technology can integrate many kinds of semiconductor chips in smaller areas compared to a conventional package with a single semiconductor chip.

As the size of a semiconductor product decreases, it is necessary to scale down the semiconductor package. Further, although the number of semiconductor chips in each package should be increased to meet demands for large capacity and multiple functions, it is also desirable to develop a packaging technology that can realize a highly-reliable and small semiconductor package housing a large number of semiconductor chips.

SUMMARY

In one embodiment, a semiconductor package comprises a package substrate; a first chip stack and a second chip stack mounted side by side on the package substrate, wherein the first and second chip stacks each include a plurality of semiconductor chips stacked on the package substrate, wherein each of the semiconductor chips includes a plurality of bonding pads provided on a respective edge region thereof, wherein at least some of the plurality of bonding pads are functional pads, and wherein the functional pads occupy a region that is substantially less than an entirety of the respective edge region.

In some embodiments, the package further may further comprise a third chip disposed on the package substrate between the first chip stack and the second chip stack.

In some embodiments, the edge region includes a first region and a second region, and a density of the functional bonding pads in the first region is substantially greater than a density of the functional bonding pads.

In some embodiments, the first and second chip stacks each have a substantially staircase-like structure.

In some embodiments, at least some of the plurality of bonding pads are dummy pads, and the dummy pads occupy a portion of the edge region that is not occupied by the functional bonding pads.

In some embodiments, the functional bonding pads are electrically connected to integrated circuits of the semiconductor chips, wherein the dummy pads are not electrically connected to the integrated circuits, and wherein the functional bonding pads of the first chip stack and the dummy pads of the second chip stack are arranged adjacent to each other.

In some embodiments, the functional bonding pads of the first chip stack are connected to the package substrate through the dummy pads of the second chip stack.

In some embodiments, the first chip stack and the second chip stack are connected to the package substrate via bonding wires.

In some embodiments, a semiconductor package comprises a package substrate; a first chip stack and a second chip stack mounted side by side on the package substrate and connected to the package substrate via bonding wires, wherein the first and second chip stacks each include a plurality of semiconductor chips stacked on the package substrate, the first and second chip stacks each having a staircase structure, wherein each of the semiconductor chips includes functional bonding pads provided on an edge region of a top surface thereof, the functional bonding pads occupying substantially less than an entirety of the edge region, and wherein the functional bonding pads of the first chip stack are not arranged adjacent to the functional bonding pads of the second chip stack.

In some embodiments, a semiconductor package comprises a package substrate; and a first chip stack and a second chip stack mounted side by side on the package substrate, wherein the first chip stack includes a plurality of first semiconductor chips, the first semiconductor chips each including a plurality of first bonding pads arranged along a first edge thereof, and wherein the second chip stack includes a plurality of second semiconductor chips, the second semiconductor chips each including a plurality of second bonding pads arranged along a second edge facing the first edge.

In some embodiments, the package may further comprise one or more third semiconductor chips mounted on the package substrate between the first chip stack and the second chip stack to be electrically coupled to at least one of the first and second chip stacks.

In some embodiments, the one or more third chips are aligned with each other between the first and second chip stacks.

In some embodiments, the one or more third chips are a controller chip, a DRAM chip or a telecommunication chip.

In some embodiments, the first edge and the second edge have substantially the same length, and wherein the first and the second edge are substantially parallel to each other.

In some embodiments, the first and second semiconductor chips are non-volatile memory devices.

In some embodiments, at least some of the plurality of first bonding pads and at least some of the plurality of second bonding pads are functional bonding pads, and wherein the functional bonding pads occupy a region that is substantially less than an entirety of the edge region.

In some embodiments, the functional bonding pads of the first chip stack are not arranged adjacent to the functional bonding pads of the second chip stack.

In some embodiments, at least one of the first and second semiconductor chips comprises a chip pad formed on a center region of the at least one of the first and second semiconductor chips and coupled to the first or second bonding pads via a redistribution line.

In some embodiments, a semiconductor package, comprising: a package substrate; a first chip stack including a plurality of first semiconductor chips stacked stepwise on the package substrate, the plurality of first semiconductor chips constituting a first lower stack and a second upper stack, wherein each of the first semiconductor chips has a first edge region and a second edge region arranged opposite to each other; a second chip stack including a plurality of second semiconductor chips stacked on the package substrate, the plurality of second semiconductor chips constituting a second lower stack and a second upper stack, wherein each of the second semiconductor chips has a first edge region and a second edge region arranged opposite to each other, wherein the second edge region of each of the first semiconductor chips is arranged adjacent to the first edge region of a corresponding one of the second semiconductor chips, wherein each of the first semiconductor chips in the first upper stack includes first functional bonding pads arranged on the second edge region of a top surface thereof, wherein each of the second semiconductor chips in the second upper stack includes second functional bonding pads arranged on the first edge region of a top surface thereof, wherein the plurality of first functional bonding pads are formed on substantially less than an entirety of the second edge region.

In some embodiments, a majority of the functional bonding pads of the first chip stack are not arranged adjacent to a majority of the functional bonding pads of the second chip stack.

In some embodiments, a majority of the functional bonding pads of the first chip stack are not arranged adjacent to a majority of the functional bonding pads of the second chip stack.

In some embodiments, the first functional bonding pads occupy approximately half an area of the second edge region of each of the first semiconductor chips.

In some embodiments, each of the first semiconductor chips in the first upper stack includes first dummy pads arranged in a portion of the second edge region not occupied by the first functional bonding pads (disposed along a portion of the second edge region that does not include the first functional bonding pads).

In some embodiments, each of the second semiconductor chips in the second upper stack includes second dummy pads arranged in a portion of the second edge region not occupied by the second functional bonding pads (disposed along a portion of the second edge region that does not include the second functional bonding pads).

In some embodiments, the first functional bonding pads of the first upper stack is disposed adjacent to the second dummy pads of the second lower stack.

In some embodiments, the first semiconductor chips in the first upper stack are electrically connected to the package substrate through the second dummy pads provided on the second lower stack.

In some embodiments, a substantial portion of the second edge region of each first semiconductor chip does not include the first functional bonding pads.

In some embodiments, the plurality of first functional bonding pads provided on the second edge region occupy about half of an area of the second edge region.

In some embodiments, the first chip stack and the second chip stack are mounted side by side and spaced apart from each other.

In some embodiments, the first and second chip stacks both have a staircase structure arranged in the same direction.

In some embodiments, the first and second chip stacks each have a staircase structure arranged in the opposite direction.

In some embodiments, the first semiconductor chips are stacked in such a way that a direction in which the chips are offset from each other thereof changes at least once in the stack.

In some embodiments, the first upper stack is arranged on the first lower stack such that the first chip stack has a concave-shaped left side portion and a convex-shaped right side portion and forming a first nose-like structure.

In some embodiments, at least a portion of the first nose-like structure (the convex right portion) is arranged within a space in the concave-shaped left side portion of the second chip stack.

In some embodiments, the first nose-like structure at least partially overlaps the second lower stack, such that the package substrate is not exposed between the first and second chip stacks.

In some embodiments, the second lower stack and the second upper stack have staircase structures arranged in opposite directions such that the second chip stack has a concave-shaped left-side portion and a convex-shaped right side portion with a second nose-like structure.

In some embodiments, each of the first lower stack and the first upper stack has a leftwardly-ascending cascade structure, wherein the first lower stack has an arrangement substantially identical to that of the first upper stack such that the first upper stack and the first lower stack overlap in plan view.

In some embodiments, first and second chip stacks are symmetrical to each other with respect to a center of the package substrate.

In some embodiments, at least some of the second semiconductor chips are stacked in a rightwardly-ascending cascade structure to provide a second lower stack, and wherein each of the remaining ones of the second semiconductor chips are stacked on top of the second lower stack in a rightwardly-ascending cascade structure substantially identical to that of the second lower stack to provide a second upper stack, and wherein the second chip stack includes a second upper stack having a staircase structure arranged on a second lower stack to provide two overlapping staircase structures.

In some embodiments, the first semiconductor chips are stacked in a leftwardly-ascending or rightwardly-descending cascade structure, while the second semiconductor chips are stacked in a rightwardly-ascending or leftwardly-descending cascade structure to form a v-shaped structure.

In some embodiments, an edge region of the first chip stack having the first functional bonding pads is positioned adjacent to an edge region of the second chip stack that does not include any pads, and wherein an edge region of the second chip stack having the second functional bonding pads is positioned adjacent to an edge region of the first chip stack that does not include any pads.

In some embodiments, the first semiconductor chips are electrically connected to the package substrate via first boning wires, which are coupled to the first functional bonding pads and extend to a center region of the package substrate, and wherein the second semiconductor chips are electrically connected to the package substrate via second bonding wires, which are coupled to the second functional bonding pads and extend to the center region of the package substrate.

In some embodiments, the first and second bonding wires are connected to the center region of the package substrate but not to both edges of the package substrate.

In some embodiments, the package includes a first controller and a second controller provided on a center region of the package substrate and between the first and second chip stacks.

In some embodiments, the first controller is mounted on a right side portion of the center region of the package substrate and electrically connected to the first chip stack, and wherein the second controller is mounted on a left side portion of the center region of the package substrate and is electrically connected to the second chip stack.

In some embodiments, the first and second controllers are connected to the package substrate in a flip-chip bonding manner.

In some embodiments, the package comprises bonding wires connected between one of the first and second controllers and the package substrate through a gap region between one of the first and second controllers and one of the first and second chip stacks.

In some embodiments, the package comprises a common controller on a center region of the package substrate and between the first and second chip stacks, and wherein the common controller is electrically connected both to the first chip stack and the second chip stack.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 6C is a sectional view taken along a line B1-B2 of FIG. 6A.

FIG. 6E is a sectional view illustrating a modification of the semiconductor package of FIG. 6C.

Figure 1A:
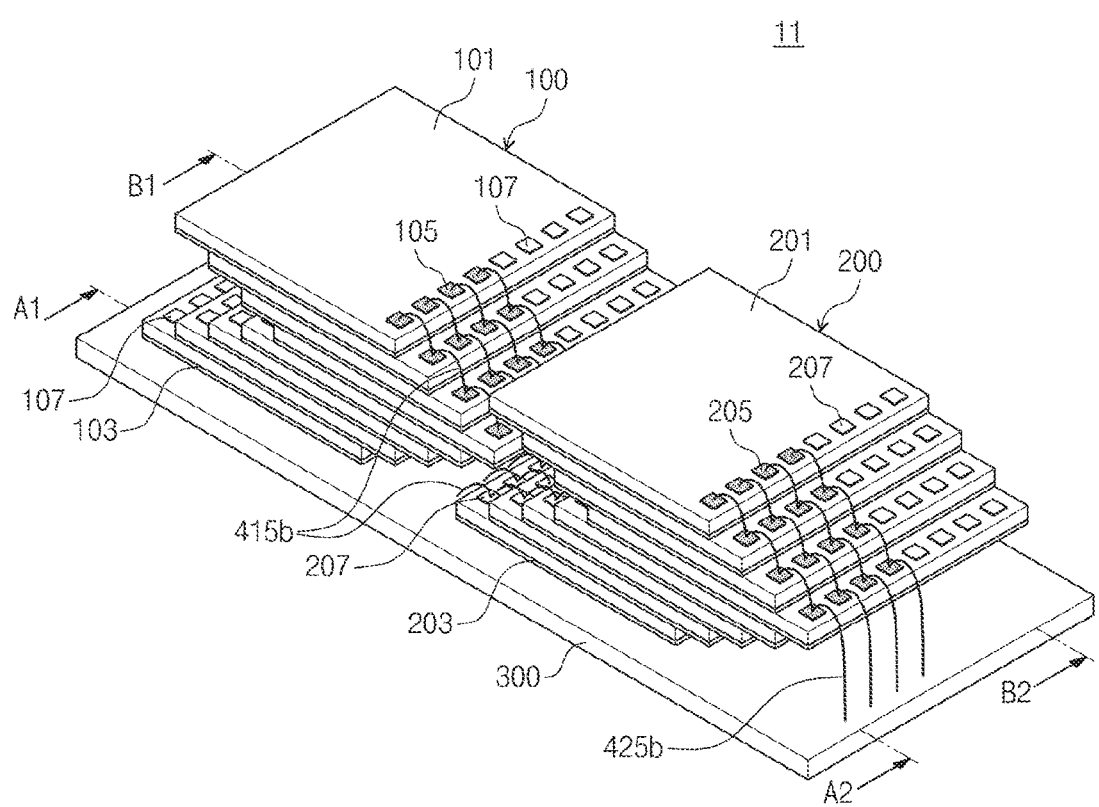
FIGS. 1A and 1B are perspective views illustrating a semiconductor package according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example Embodiments

Figure 1B:
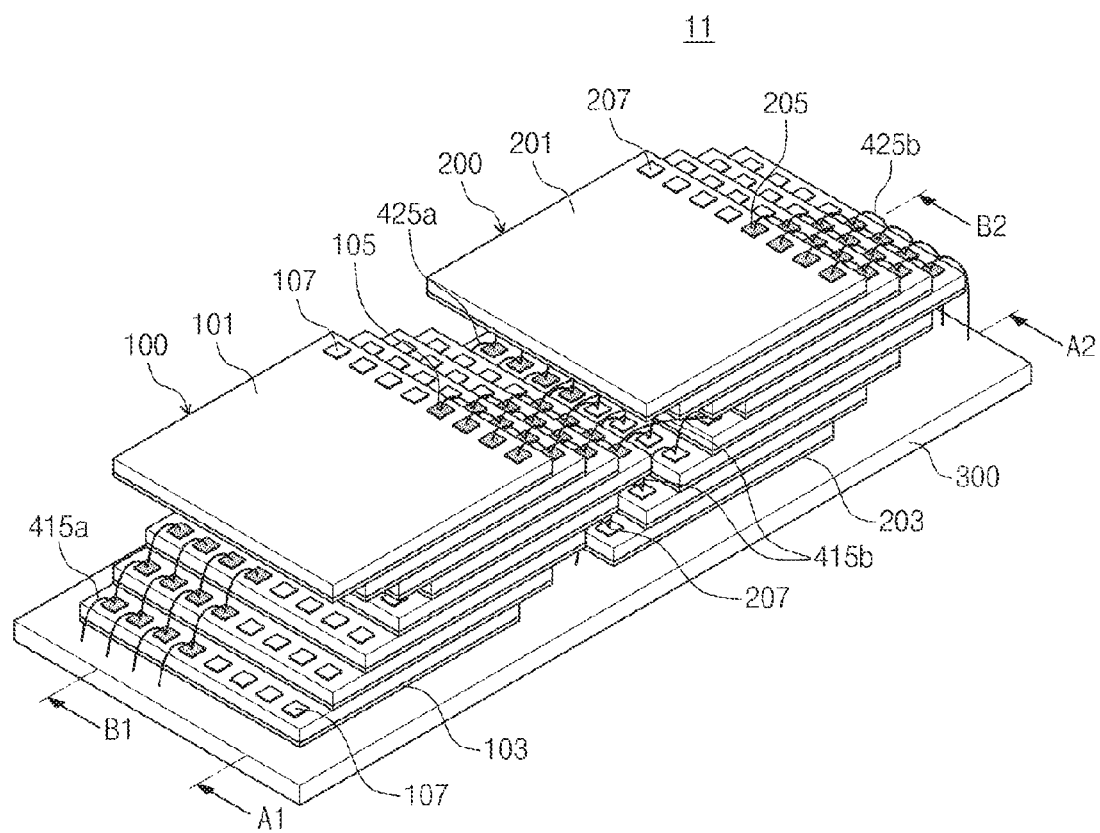
Figure 1C:
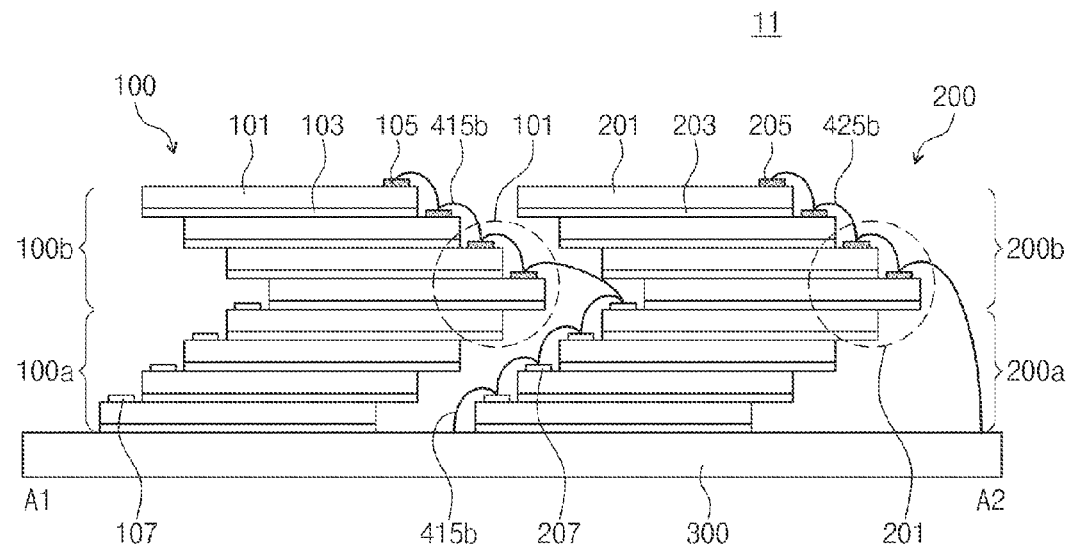
FIG. 1C is a sectional view taken along a line A1-A2 of FIG. 1A.
Figure 1D:
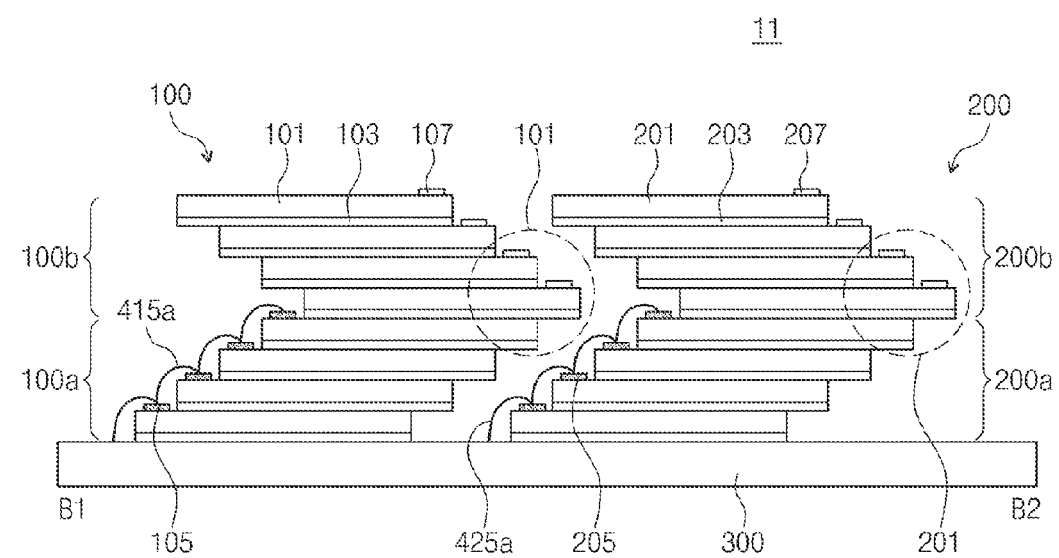
FIG. 1D is a sectional view taken along a line B1-B2 of FIG. 1A.
Figure 1E:
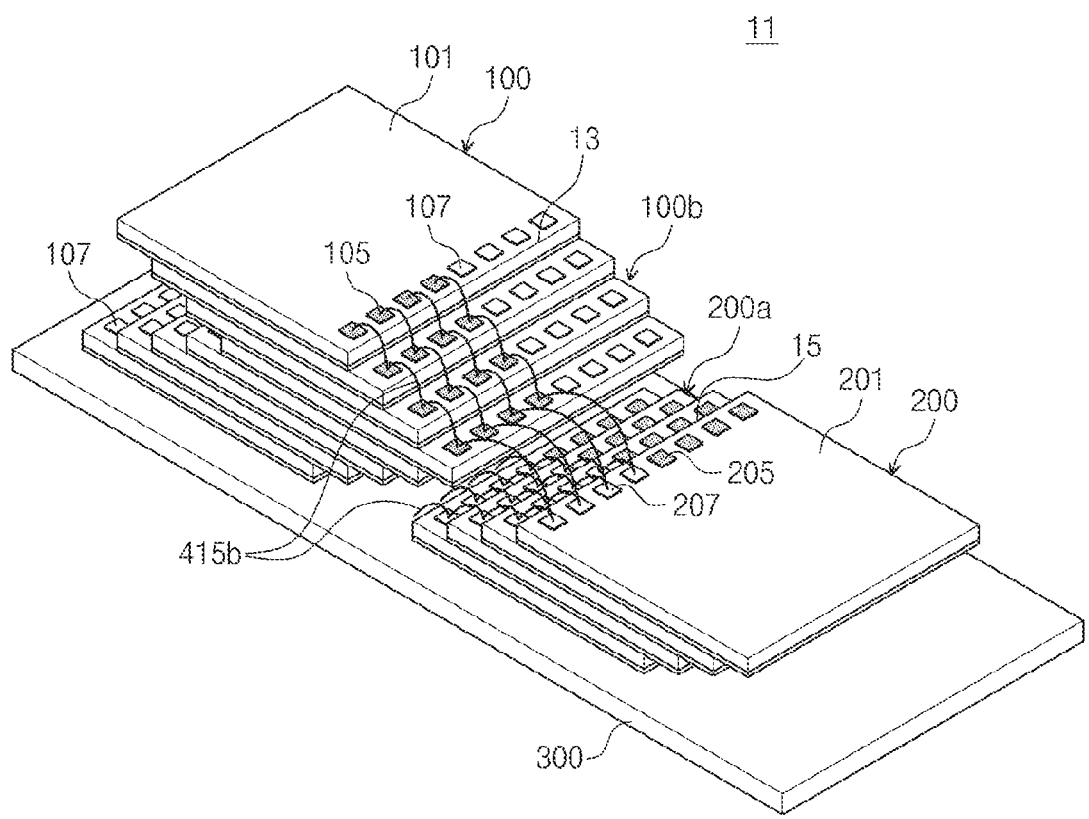
FIG. 1E is a perspective view illustrating a portion of the semiconductor package of FIG. 1A.

FIGS. 1A and 1B are perspective views illustrating a semiconductor package according to example embodiments of the inventive concept. FIG. 1C is a sectional view taken along line A1-A2 of FIG. 1A. FIG. 1D is a sectional view taken along line B1-B2 of FIG. 1A. FIG. 1E is a perspective view illustrating a portion of the semiconductor package of FIG. 1A.

Referring to FIGS. 1A, 1B, 1C, and 1D, a semiconductor package 11 may include a package substrate 300 (e.g., a printed circuit board), a first chip stack 100 including a plurality of first semiconductor chips 101 stacked on the package substrate 300, and a second chip stack 200 including a plurality of second semiconductor chips 201 stacked on the package substrate 300. Each of the first and second semiconductor chips 101 and 201 may be a memory chip, a logic chip, or any combination thereof. The first and second chip stacks 100 and 200 may have the same stepwise structure and may be attached to the package substrate 300. The package substrate 300 may be configured to apply the same or different electrical signals to the first and second chip stacks 100 and 200.

A first adhesive layer 103 may be provided between the first semiconductor chips 101 or on a bottom surface of each of the first semiconductor chips 101 to attach the first chip stack 100 to the package substrate 300. Similarly, a second adhesive layer 203 may be provided between the second semiconductor chips 201 or on a bottom surface of each of the second semiconductor chips 201 to attach the second chip stack 200 to the package substrate 300.

The first semiconductor chips 101 may be provided to have an edge pad structure; for example, bonding pads may be locally arranged on one edge region of the first semiconductor chip 101. In example embodiments, each of the first semiconductor chips 101 may include first functional bonding pads 105 and first dummy pads 107 that are locally provided on one edge region (e.g., right edge region) of a top surface thereof. The first functional bonding pads 105 may mean bonding pads that are electrically connected to integrated circuits of the first semiconductor chip 101, while the first dummy pads 107 may not be electrically connected to any integrated circuit. The functional bonding pads according to the present disclosure may mean bonding pads that are electrically connected to the integrated circuits of a semiconductor chip. The dummy pads according to the present disclosure may mean bonding pads that are not electrically connected to the integrated circuits of a semiconductor chip. The dummy pads may just be connected to the adjacent semiconductor chips via bonding wires as illustrated in FIG. 1C, for example.

In some embodiments, at least some of the bonding pads of the first semiconductor chips 101 may be functional bonding pads. The functional bonding pads may occupy a region that is substantially less than an entirety of the edge region. For example, the first functional bonding pads 105 may occupy, for example, half an area of the edge region of the first semiconductor chip 101, and the first dummy pads 107 may occupy the remaining area of the edge region of the first semiconductor chip 101.

Each of the second semiconductor chips 201 may have the edge pad structure; for example, each of the second semiconductor chips 201 may include second functional bonding pads 205 and second dummy pads 207 that are locally provided on one edge region (e.g., right edge region) of a top surface thereof. In some embodiments, at least some of the bonding pads of the second semiconductor chips 201 are functional bonding pads. The functional bonding pads may occupy a region that is substantially less than an entirety of the edge region.

In some embodiments, the edge region may be described as having a first region and a second region (not illustrated in the drawing), and a density of the functional bonding pads in the first region may be substantially greater than a density of the functional bonding pads in the second region. In some embodiments, the functional bonding pads may not even be present in the second region.

In some embodiments, at least some of the bonding pads of the first semiconductor chips 101 and/or the second semiconductor chips 201 may be dummy pads, and the dummy pads may occupy a portion of the edge region that is not occupied by the functional bonding pads.

In some embodiments, the first and second semiconductor chips 101, 201 may be non-volatile memory devices such as flash memories.

The second functional bonding pads 205 may be electrically connected to integrated circuits of the second semiconductor chip 201 and may occupy, for example, half an area of the edge region of the second semiconductor chip 201. The second dummy pads 207 may not be electrically connected to the integrated circuits of the second semiconductor chip 201 and may occupy the remaining area of the edge region of the second semiconductor chip 201.

The first semiconductor chips 101 may be stacked stepwise to expose the first electric and dummy pads 105 and 107. The first semiconductor chips 101 may also be stacked in such a way that a stacking direction (or a sloping direction) thereof changes at least once. For example, as shown in FIG. 1C or 1D, the first (e.g., four) semiconductor chips 101 forming a first lower stack 100a may be stacked one on top of the other, with the location of each successive chip 101 being shifted rightward with respect to the package substrate 300 to expose the first electric and dummy pads 105 and 107 of the first semiconductor chip 101 arranged thereunder. In this manner, the first lower stack 100a may have a rightwardly-ascending or leftwardly-descending cascade structure.

Each of the remaining ones (e.g., four) of the first semiconductor chips 101 forming a first upper stack 100b may be stacked one on top of the other on the first lower stack 100a, with the location of each successive chip 101 being shifted leftward to expose the first electric and dummy pads 105 and 107 of the first semiconductor chip 101 arranged thereunder. In this manner, the first upper stack 100b of first semiconductor chips 101 may have a leftwardly-ascending or rightwardly-descending cascade structure. The first upper stack 100b may be arranged on the first lower stack 100a such that the overall shape of the first chip stack 100 has a concave left-side portion and a convex right-side portion with a first nose-like structure 111.

The second semiconductor chips 201 may be stacked in the same or a similar manner as the first semiconductor chips 101 to expose the second electric and dummy pads 205 and 207 arranged thereunder. For example, as shown in FIG. 1C or 1D, each of some (e.g., four) of the second semiconductor chips 201 forming a second lower stack 200a may be stacked one on top of the other, with the location of each successive chip 201 being shifted rightward with respect to the package substrate 300. In this manner, the second lower stack 200a of the second semiconductor chips 201 may have a rightward-ascending or leftward-descending cascade structure.

Each of the remaining ones (e.g., four) of the second semiconductor chips 201 forming a second upper stack 200b may be stacked one on top of the other on the second lower stack 200a, with the location of each successive chip 201 being shifted leftward with respect to the package substrate 300. In this manner, the second upper stack 200b of the second semiconductor chips 201 may have a leftwardly-ascending or rightwardly-descending cascade structure. The second upper stack 200b may be arranged on the second lower stack 200a such that overall shape of the second chip stack 200 has a concave left-side portion and a convex right-side portion with a second nose-like structure 211.

As described above, the first and second chip stacks 100 and 200 may have the same stepwise structure, and the first semiconductor chips 101 and the second semiconductor chips 201 may have the same edge pad structure. The first and second chip stacks 100 and 200 may be mounted side by side on the package substrate 300. According to some embodiments, at least a portion of the first nose-like structure 111 may be arranged within the concave left-side portion of the second chip stack 200. Thus, the first nose-like structure 111 may at least partially overlap the second lower stack 200a, thereby preventing the package substrate 300 from being exposed between the first and second chip stacks 100 and 200. Accordingly, it is possible to reduce an area, occupied by the first and second chip stacks 100 and 200, of the package substrate 300. Alternatively, the first and second chip stacks 100 and 200 may be provided in such a way that the first nose-like structure 111 does not overlap the second lower stack 200a in plan view. In this case, the package substrate 300 may be partially exposed between the first and second chip stacks 100 and 200.

When viewed in FIGS. 1A and 1C, the second semiconductor chips 201 of the second upper stack 200b may be electrically connected to the package substrate 300 via second upper bonding wires 425b, which are coupled to the second functional bonding pads 205 and are elongated to the right edge of the package substrate 300.

When viewed in FIGS. 1B and 1D, the second semiconductor chips 201 of the second lower stack 200a may be electrically connected to the package substrate 300 via second lower bonding wires 425a, which are coupled to the second functional bonding pads 205 and are elongated to a center of the package substrate 300.

When viewed in FIGS. 1B and 1D, the first semiconductor chips 101 of the first lower stack 100a may be electrically connected to the package substrate 300 via first lower bonding wires 415a, which are coupled to the first functional bonding pads 105 and are elongated to a left edge of the package substrate 300.

When viewed in FIGS. 1A and 1C, the first semiconductor chips 101 of the first upper stack 100b may be electrically connected to the package substrate 300 through the second dummy pads 207 provided on the second lower stack 200a of the second chip stack 200. For example, as shown in FIG. 1C, the package substrate 300 in the area between the first and second chip stacks 100 and 200, respectively, may be at least partially covered by the first nose-like structure 111 of the first chip stack 100. This may lead to a difficulty in directly connecting first upper bonding wires 415b, which are connected to the first functional bonding pads 105 of the first semiconductor chips 101 of the first upper stack 100b, to the package substrate 300.

According to the present embodiment, as shown in FIG. 1E, the first functional bonding pads 105 of the first upper stack 100b may be disposed adjacent to the second dummy pads 207 of the second lower stack 200a. Accordingly, the first semiconductor chips 101 of the first upper stack 100b can be electrically connected to the package substrate 300 through the first upper bonding wires 415b, which are coupled to the first functional bonding pads 105 and further coupled to the second dummy pads 207, extending to the center of the package substrate 300.

The second lower stack 200a may be applied with electrical signals, which are the same as or different from those applied to the second upper stack 200b, from the package substrate 300. Similarly, the first lower stack 100a may be applied with electrical signals, which are the same as or different from those applied to the first upper stack 100b, from the package substrate 300.

In some embodiments, the first semiconductor chips 101 each include the plurality of first bonding pads 105 arranged along at least a portion of a first edge 13 thereof and the second semiconductor chips 201 each include a plurality of second bonding pads 205 arranged along at least a portion of a second edge 15 facing the first edge 13. The first edge 13 and the second edge 15 may have substantially the same length and substantially parallel to each other.

Other Example Embodiments

Figure 2A:
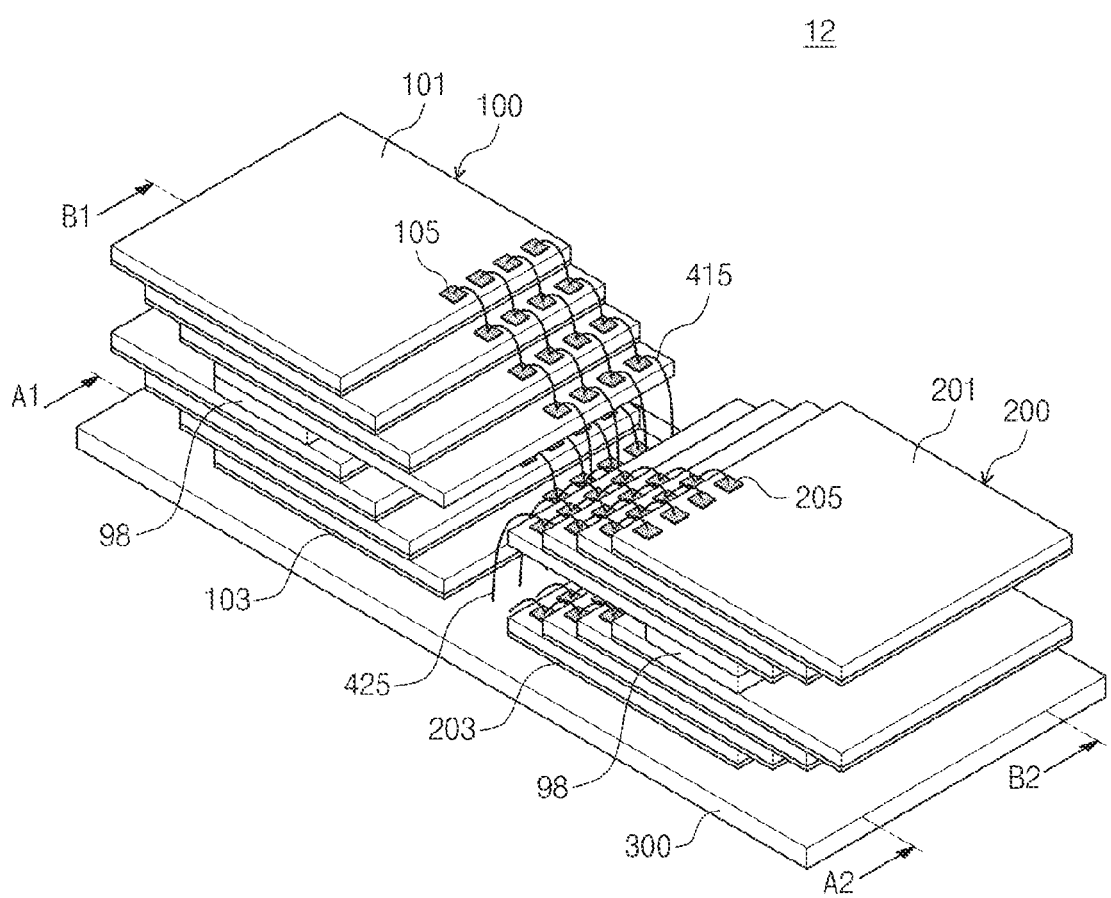
FIG. 2A is a perspective view illustrating a semiconductor package according to other example embodiment of the inventive concept.
Figure 2B:
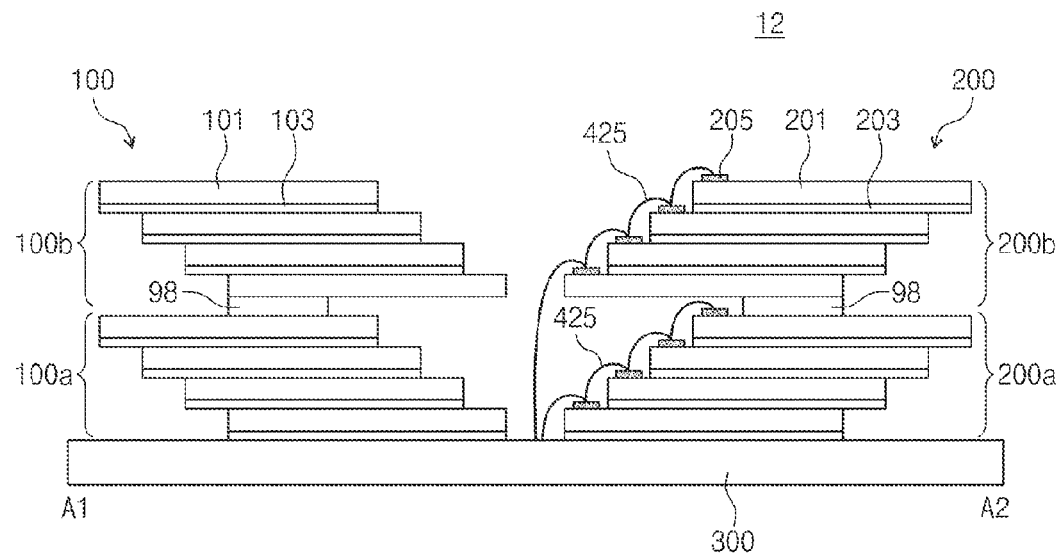
FIG. 2B is a sectional view taken along a line A1-A2 of FIG. 2A.
Figure 2C:
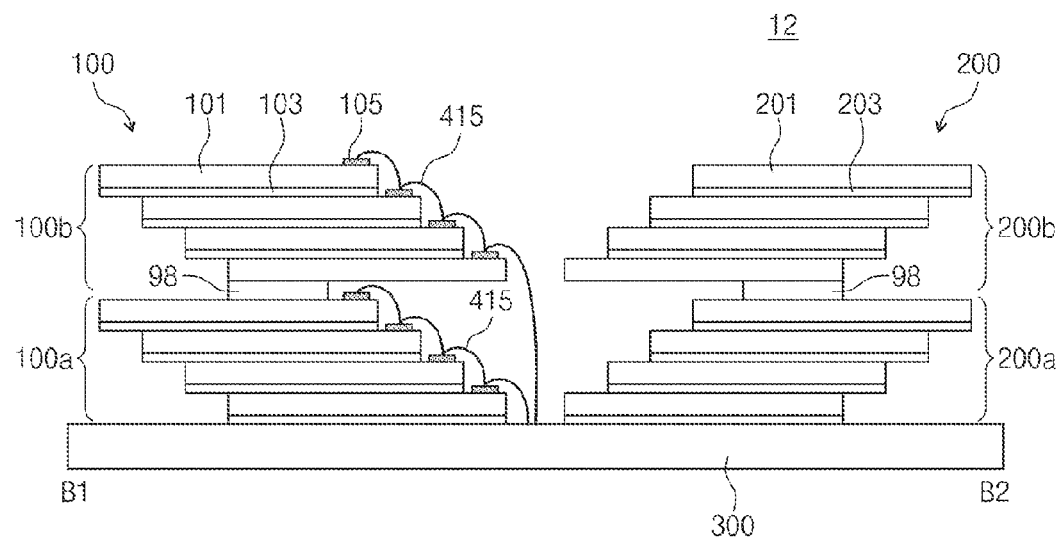
FIG. 2C is a sectional view taken along a line B1-B2 of FIG. 2A.
Figure 2D:
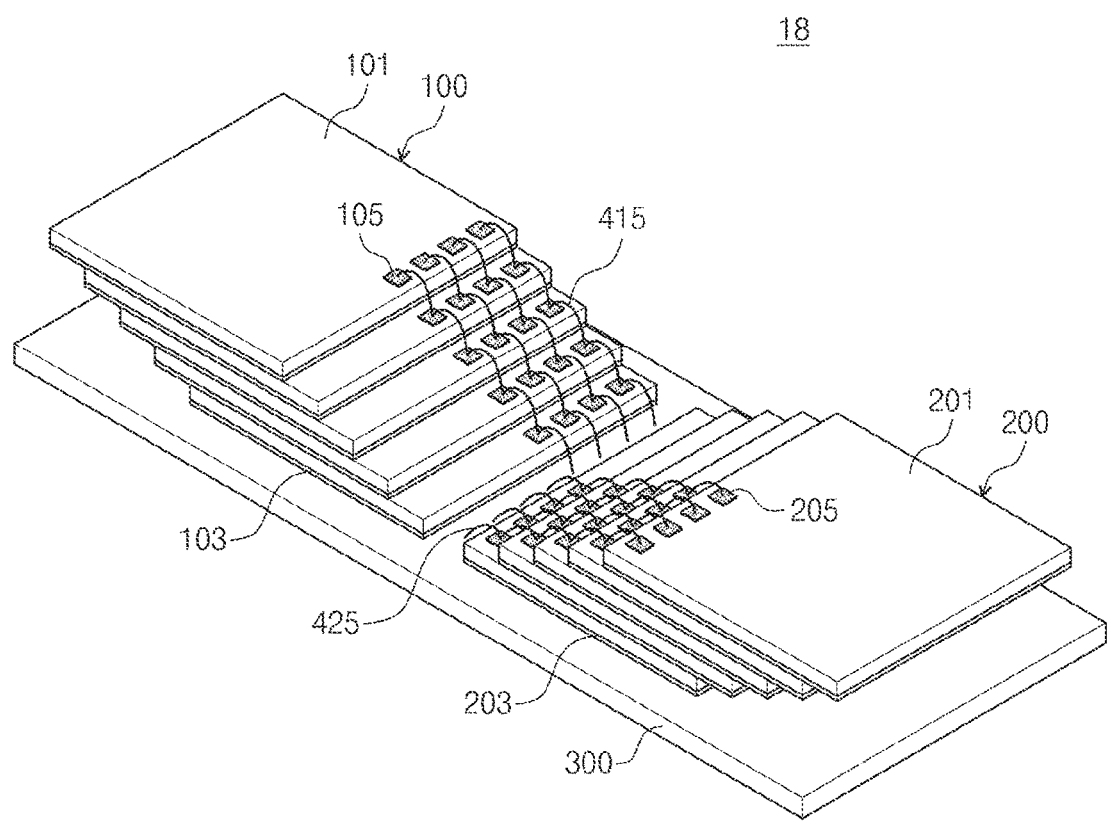
FIG. 2D is a perspective view illustrating a modification of the semiconductor package of FIG. 2A.

FIG. 2A is a perspective view illustrating a semiconductor package according to other example embodiment of the inventive concept. FIG. 2B is a cross-sectional view taken along line A1-A2 of FIG. 2A. FIG. 2C is a cross-sectional view taken along line B1-B2 of FIG. 2A. FIG. 2D is a perspective view illustrating a modification of the semiconductor package of FIG. 2A.

Referring to FIGS. 2A, 2B, and 2C, a semiconductor package 12 may include the package substrate 300, the first chip stack 100 including the plurality of first semiconductor chips 101 stacked on the package substrate 300, and the second chip stack 200 including the plurality of second semiconductor chips 201 stacked on the package substrate 300. The first and second chip stacks 100 and 200 may have a stepwise structure extending in the opposite direction and may be connected to the package substrate 300 using a wire bonding technology.

The first semiconductor chips 101 may have an edge pad structure. For example, each of the first semiconductor chips 101 may include the first functional bonding pads 105 provided on one edge region (e.g., right edge region) of the top surface thereof. The first functional bonding pads 105 may occupy half the area of the edge region of the first semiconductor chip 101.

Each of second semiconductor chips 201 may have the edge pad structure; for example, each of the second semiconductor chips 201 may include the second functional bonding pads 205 that are locally provided on one edge region (e.g., left edge region) of the top surface thereof. The second functional bonding pads 205 may be provided to occupy, for example, half the area of the edge region of the second semiconductor chip 201.

The first semiconductor chips 101 may be stacked stepwise to expose the first functional bonding pads 105. For example, some (e.g., four) of the first semiconductor chips 101 forming a first lower stack 100a may be stacked one on top of the other, with the location of each successive chip 101 being shifted leftward with respect to the package substrate 300 to expose the first functional pad 105 of the first semiconductor chip 101 arranged thereunder. In this manner, the first lower stack 100a of first semiconductor chips 101 may have a leftwardly-ascending or rightwardly-descending cascade structure. Similarly, each of the remaining ones (e.g., four) of the first semiconductor chips 101 forming a first upper stack 100b may be stacked one on top of the other on the first lower stack 100a, with the location of each successive chip 101 being shifted leftward to expose the first functional pad 105 of the first semiconductor chip 101 arranged thereunder. In this manner, the first upper stack 100b of first semiconductor chips 101 may have a leftwardly-ascending or rightwardly-descending cascade structure that is substantially identical to that of the first lower stack 100a. By stacking the first upper stack 100b on the first lower stack 100a, it is possible to provide a first chip stack 100 including two staircase structures that overlap in plan view. The first upper stack 100b may be mounted on the first lower stack 100a using an adhesive layer 98.

The second semiconductor chips 201 may be stacked in the same or a similar manner as the first semiconductor chips 101 to expose the second functional bonding pads 205, but with an opposite shift in the arrangement of the staircase structure. For example, the (e.g., four) second semiconductor chips 201 forming a second lower stack 200a may be stacked one on top of the other with a rightward shift in the location of each successive chip 201 on the package substrate 300 to provide a second lower stack 200a having a rightwardly-ascending or leftwardly-descending cascade structure. The remaining second semiconductor chips 201 forming a second upper stack 200b may be stacked on top of the second lower stack 200a with a rightwardly-ascending or leftwardly-descending cascade structure that is substantially identical to that of the second lower stack 200a. By stacking the second upper stack 200b on the second lower stack 200a in this manner, it is possible to provide a second chip stack 200 that includes two overlapping staircase structures when viewed in plan view.

As described above, the first and second chip stacks 100 and 200 may have the same stacking structure, and the first semiconductor chips 101 and the second semiconductor chips 201 may have the same edge pad structure. The first and second chip stacks 100 and 200 may be mounted side by side on the package substrate 300.

The first and second chip stacks 100 and 200 may be symmetrical to each other with respect to a center line (not illustrated) of the package substrate dividing the package substrate 300. For example, in the case where the first chip stack 100 has the leftwardly-ascending staircase structure, the first functional bonding pads 105 of the first chip stack 100 may be disposed along line B1-B2. In the case where the second chip stack 200 has the rightwardly-ascending staircase structure, the second functional bonding pads 205 of the second chip stack 200 may be disposed along line A1-A2. Due to the symmetric arrangement of the first and second chip stacks 100 and 200, an edge region of the first chip stack 100 provided with the first functional bonding pads 105 may be positioned adjacent to an edge region of the second chip stack 200 that does not include any pads, and an edge region of the second chip stack 200 provided with the second functional bonding pads 205 may be positioned adjacent to an edge region of the first chip stack 100 that does not have any pads.

Thus, in some embodiments, the functional bonding pads 105 of the first chip stack 100 may not be arranged adjacent to the functional bonding pads 205 of the second chip stack 200.

The second semiconductor chips 201 may be electrically connected to the package substrate 300 via second bonding wires 425, which are coupled to the second functional bonding pads 205 and extend to the center region of the package substrate 300, as shown in FIG. 2B. The second bonding wires 425 may be connected to a left-side portion (e.g., adjacent to or disposed on line A1-A2) of the center region of the package substrate 300, when viewed from the right side of the semiconductor package 12 shown in FIG. 2A.

The first semiconductor chips 101 may be electrically connected to the package substrate 300 via first bonding wires 415, which are coupled to the first functional bonding pads 105 and extend to the center region of the package substrate 300, as shown in FIG. 2C. The first bonding wires 415 may be connected to a right-side portion (e.g., adjacent to or disposed on line B1-B2) of the center region of the package substrate 300, when viewed from the right side of the semiconductor package 12 shown in FIG. 2A. As a result, the first bonding wires 415 and the second bonding wires 425 may be connected to the center region of the package substrate 300, without problems of interference or contact therebetween.

According to the present embodiment, the first and second bonding wires 415 and 425 may be connected to the center region of the package substrate 300 but not to both edges of the package substrate 300. Accordingly, it is possible to reduce an area of the edge region in the package substrate 300, thereby reducing or minimizing a size of the semiconductor package 12.

As shown in FIG. 2B, the second bonding wires 425 connected to the second lower stack 200a may be electrically connected to the package substrate 300, while being separated from the second bonding wires 425 connected to the second upper stack 200b. Accordingly, electrical signals can be independently applied to the second lower stack 200a and the second upper stack 200b from the package substrate 300. Alternatively, the second bonding wires 425 connected to the second lower stack 200a may be electrically connected to the package substrate 300, while being joined together with the second bonding wires 425 connected to the second upper stack 200b. In this case, the same electrical signals can be applied to the second lower stack 200a and the second upper stack 200b from the package substrate 300.

Similarly, as shown in FIG. 2C, the first bonding wires 415 connected to the first lower stack 100a may be electrically connected to the package substrate 300, while being separated from the first bonding wires 415 connected to the first upper stack 100b, and in this case, electrical signals can be independently applied to the first lower stack 100a and the first upper stack 100b from the package substrate 300. Alternatively, the first bonding wires 415 connected to the first lower stack 100a may be electrically connected to the package substrate 300, while being joined together with the first bonding wires 415 connected to the first upper stack 100b, and in this case, the same electrical signals can be applied to the first lower stack 100a and the first upper stack 100b from the package substrate 300.

Technical features associated with electric connections between the bonding wires 415 and 425 and the package substrate 300 and operations of the stacks 100a, 100b, 200a, and 200b can be applied to all embodiments described herein in the same or similar manner.

In other embodiments, the first chip stack 100 may be composed of the first lower stack 100a, and the second chip stack 200 may be composed of the second lower stack 200a. For example, as shown in FIG. 2D, a semiconductor package 18 may include the first chip stack 100, in which the first semiconductor chips 101 are stacked on the package substrate 300 in a leftwardly-ascending or rightwardly-descending cascade structure, while the second chip stack 200, in which the second semiconductor chips 201 are stacked, may form a rightwardly-ascending or leftwardly-descending cascade structure. The afore-described technical features associated with the semiconductor package 12 may be applied for the semiconductor package 18 in the same or similar manner.

Still Other Example Embodiments

Figure 3A:
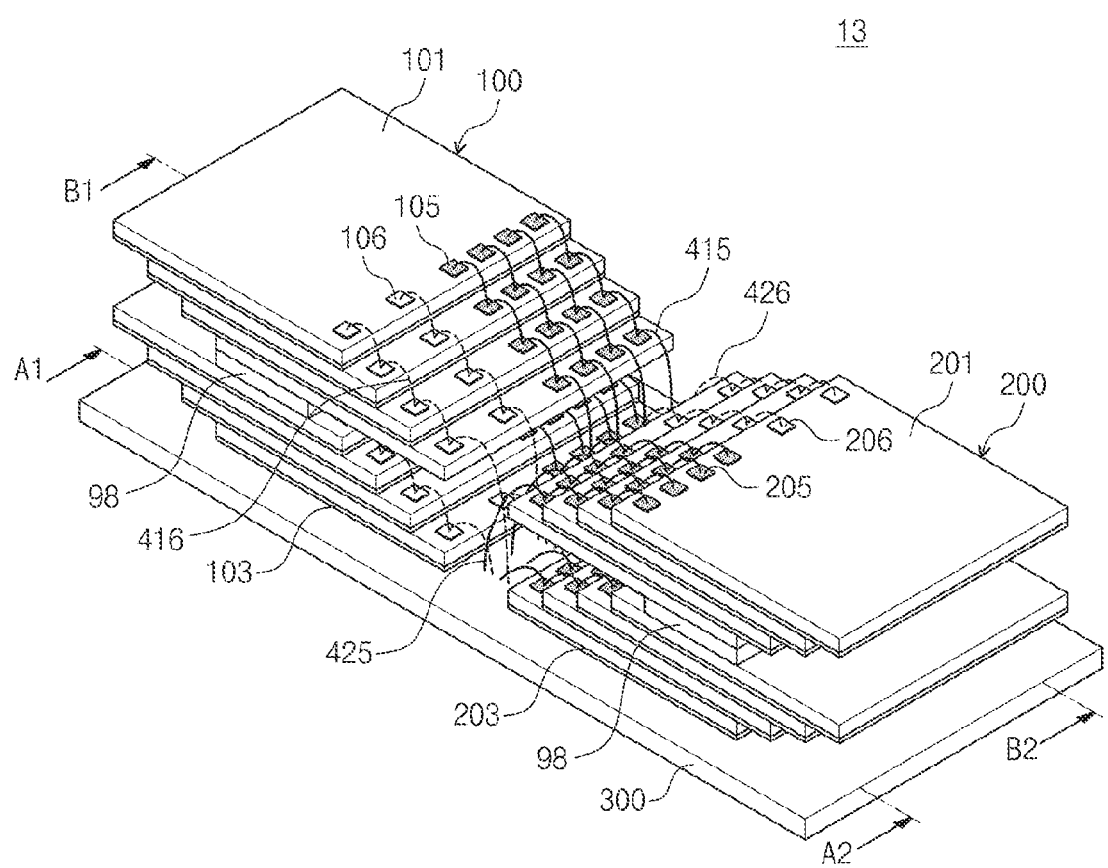
FIG. 3A is a perspective view illustrating a semiconductor package according to still other example embodiment of the inventive concept.
Figure 3B:
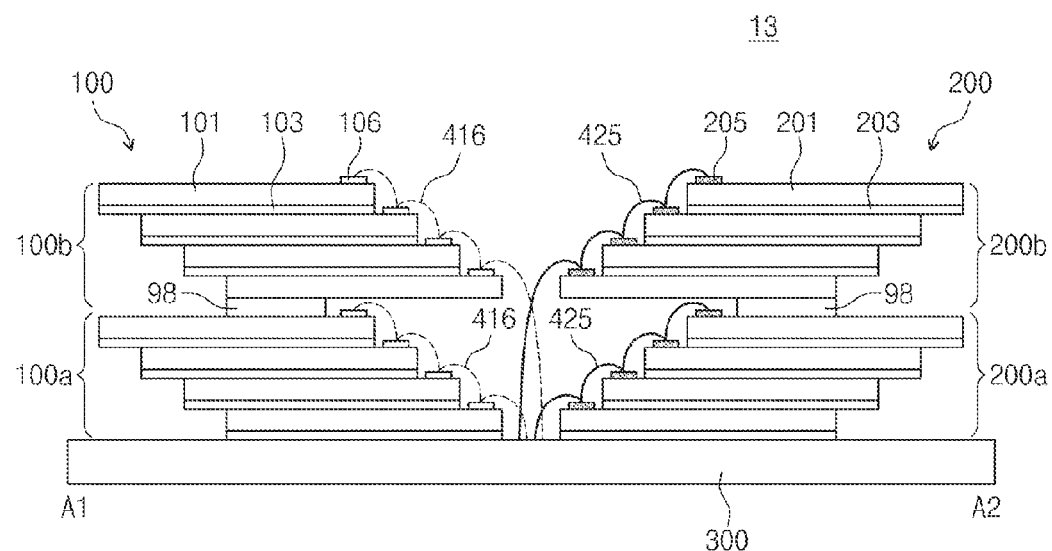
FIG. 3B is a sectional view taken along a line A1-A2 of FIG. 3A.
Figure 3C:
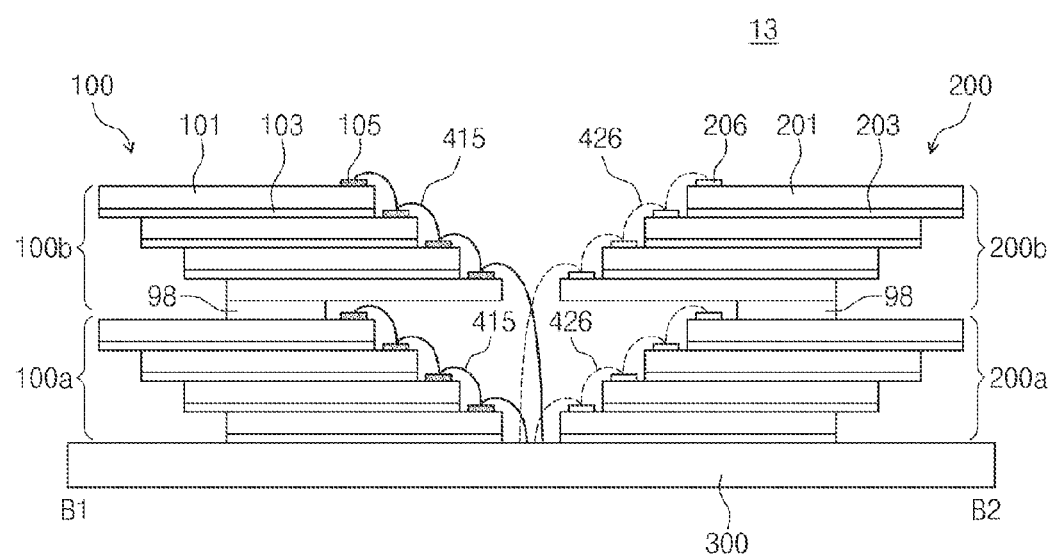
FIG. 3C is a sectional view taken along a line B1-B2 of FIG. 3A.

FIG. 3A is a perspective view illustrating a semiconductor package according to still other example embodiment of the inventive concept. FIG. 3B is a sectional view taken along line A1-A2 of FIG. 3A. FIG. 3C is a sectional view taken along line B1-B2 of FIG. 3A.

Referring to FIGS. 3A, 3B, and 3C, similar to the semiconductor package 12 of FIG. 2A, a semiconductor package 13 may include the first and second chip stacks 100 and 200 mounted on the package substrate 300. The first chip stack 100 may include the first lower and upper stacks 100a and 100b, in each of which the first semiconductor chips 101 are stacked to form the staircase structure. The second chip stack 200 may include the second lower and upper stacks 200a and 200b, each of which the second semiconductor chips 201 are stacked to form a staircase structure.

Each of the first semiconductor chips 101 may have an edge pad structure; for example, each of the first semiconductor chips 101 may include first functional bonding pads 105 and first auxiliary pads 106 that are provided on one edge region (e.g., right edge region) of the top surface thereof. The first functional bonding pads 105 may be provided to occupy half an area of the edge region of the top surface of the first semiconductor chip 101, and the first auxiliary pads 106 may occupy the remaining area of the edge region of the top surface of the first semiconductor chip 101. In certain embodiments, the number of first auxiliary pads 106 may be less than the number of first functional bonding pads 105. The first auxiliary pads 106 may have a pitch greater than that of the first functional bonding pads 105. The first auxiliary pad 106 may be electrically connected to the integrated circuits of the first semiconductor chip 101, thereby serving as input/output pathways for electrical signals (e.g., power signal, ground signal, and data signals).

Each of the second semiconductor chips 201 may be provided to have the edge pad structure; for example, each of the second semiconductor chips 201 may include second functional bonding pads 205 and second auxiliary pads 206 provided on one edge region (e.g., left edge region) of the top surface thereof. The second functional bonding pads 205 may occupy about half of an area of the edge region of the top surface of the second semiconductor chip 201, and the second auxiliary pads 206 may occupy the remaining area of the edge region of the top surface of the second semiconductor chip 201. The number and the pitch of the second bonding wires 425 may be equal or similar to those of the first bonding wires 415. The number of the second auxiliary pads 206 may be less than that of the second functional bonding pads 105, and the pitch of the second auxiliary pads 206 may be greater than that of the second functional bonding pads 105. The second auxiliary pad 206 may be electrically connected to the integrated circuits of the second semiconductor chip 201, thereby serving as input/output pathways for electrical signals (e.g., power signal, ground signal, and data signals).

The first and second chip stacks 100 and 200 may be symmetrical to each other. For example, the first chip stack 100 may have a leftwardly ascending staircase structure, and the second chip stack 200 may have a rightwardly ascending staircase structure. The first functional bonding pads 105 of the first chip stack 100 may be disposed on a region along the line B1-B2, and the first auxiliary pads 106 may be disposed on another region along the line A1-A2. The second functional bonding pads 205 of the second chip stack 200 may be disposed in another region along the line A1-A2, and the second auxiliary pads 206 may be disposed in another region along the line B1-B2. Accordingly, the first functional bonding pads 105 may be disposed adjacent to the second auxiliary pads 206, and the second functional bonding pads 205 may be disposed adjacent to the first auxiliary pads 106.

The second semiconductor chips 201 may be electrically connected to the package substrate 300 through the second bonding wires 425, which are coupled to the second functional bonding pads 205 and extended to the center region of the package substrate 300 as shown in FIG. 3B, and through second auxiliary bonding wires 426, which are coupled to the second auxiliary pads 206 and extended to the center region of the package substrate 300 as shown in FIG. 3C. As shown in FIG. 3A, the second bonding wires 425 may be connected to a left-side portion (e.g., adjacent to or disposed on the line A1-A2) of the center region of the package substrate 300, and the second auxiliary bonding wires 426 may be connected to a right-side portion (e.g., adjacent to or disposed on the line B1-B2) of the center region of the package substrate 300, when viewed from the right side of the semiconductor package 13.

The first semiconductor chips 101 may be electrically connected to the package substrate 300 through the first bonding wires 415, which are coupled to the first functional bonding pads 105 and extended to the center region of the package substrate 300, as shown in FIG. 3C, and through first auxiliary bonding wires 416, which are coupled to the first auxiliary pads 106 and extended to the center region of the package substrate 300, as shown in FIG. 3B. As shown in FIG. 3A, the first bonding wires 415 may be connected to the right side portion (e.g., adjacent to or disposed on the line B1-B2) of the center region of the package substrate 300, and the first auxiliary bonding wires 416 may be connected to the left-side portion (e.g., adjacent to or disposed on the line A1-A2) of the center region of the package substrate 300, when viewed from the right side of the semiconductor package 13.

According to the present embodiments, the first and second bonding wires 415 and 425 and the first and second auxiliary bonding wires 416 and 426 may be connected to the center region of the package substrate 300 but not to both edges of the package substrate 300.

Accordingly, it is possible to reduce an area of the edge region in the package substrate 300, thereby reducing or minimizing a size of the semiconductor package 13.

Even Other Example Embodiments and Modifications

Figure 4A:
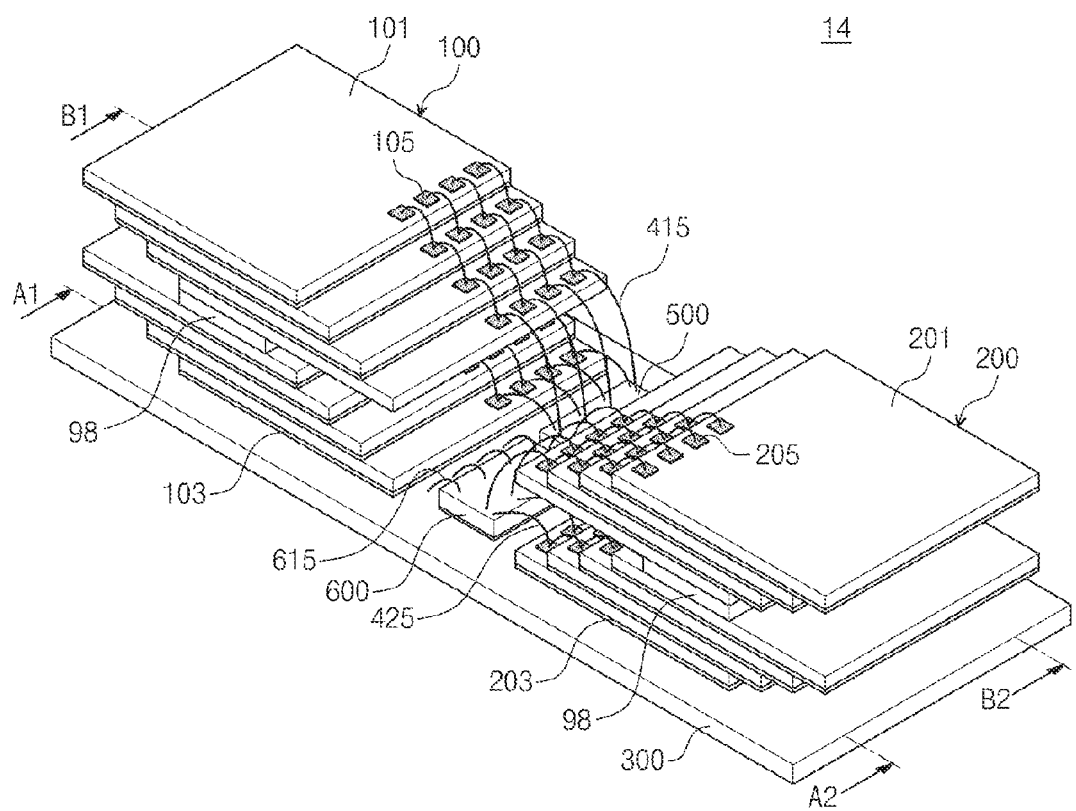
FIG. 4A is a perspective view illustrating a semiconductor package according to even other example embodiment of the inventive concept.
Figure 4B:
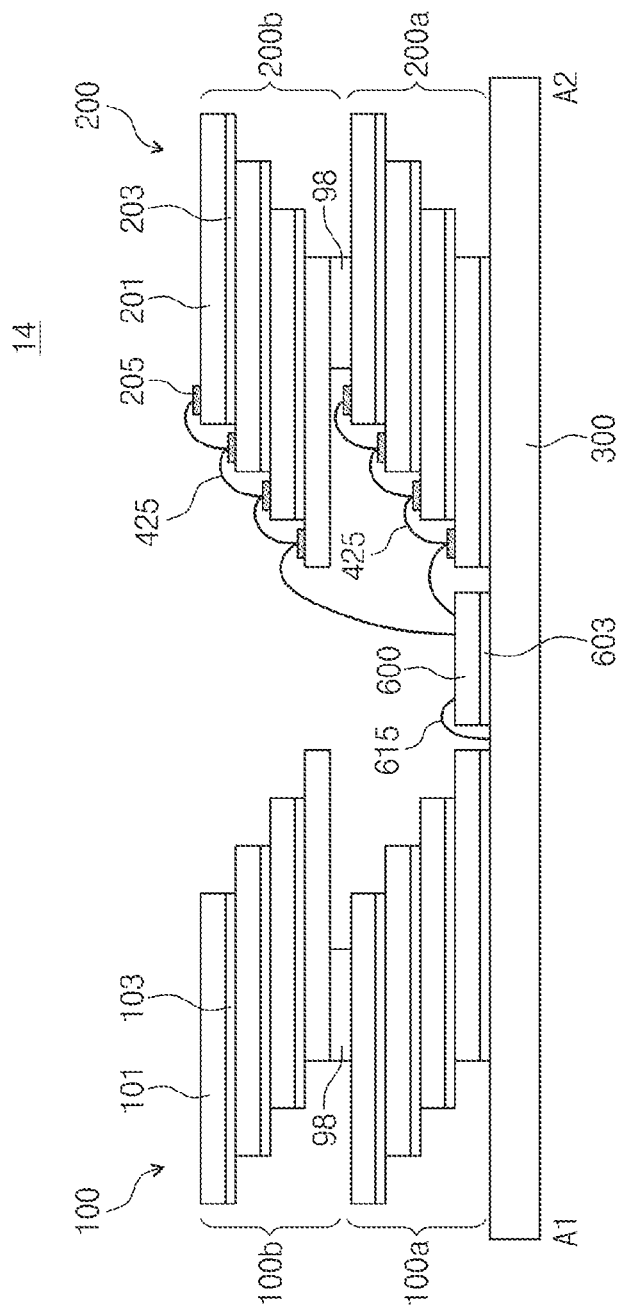
FIG. 4B is a sectional view taken along a line A1-A2 of FIG. 4A.
Figure 4C:
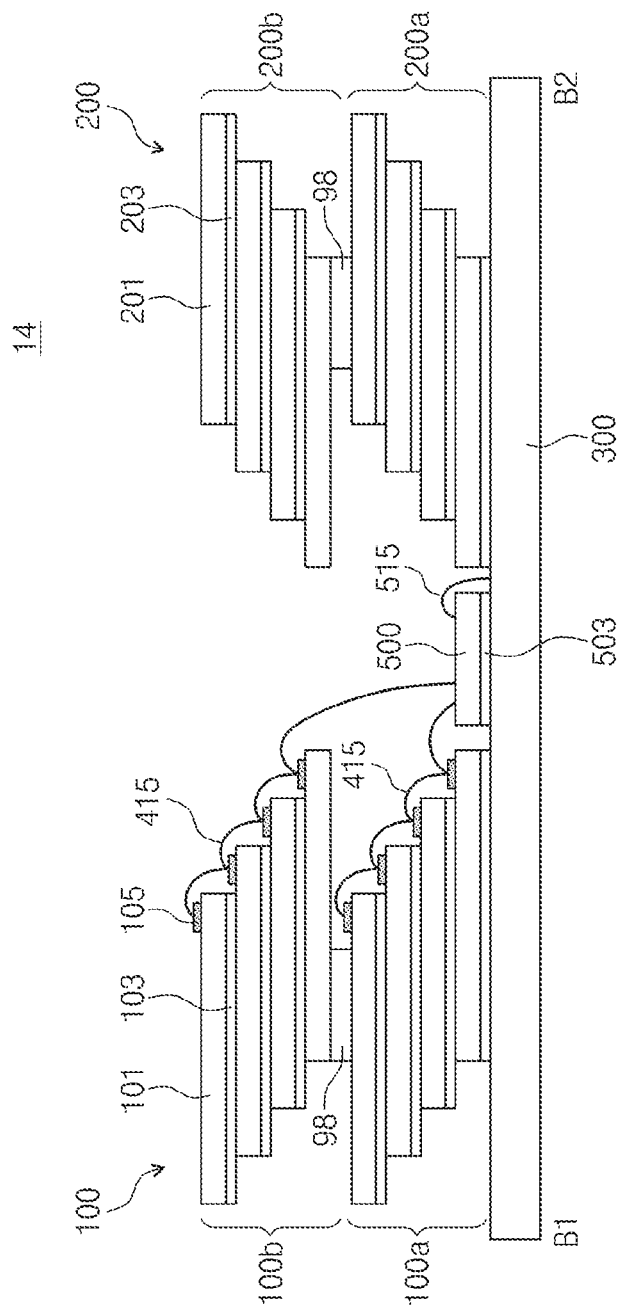
FIG. 4C is a sectional view taken along a line B1-B2 of FIG. 4A.
Figure 4D:
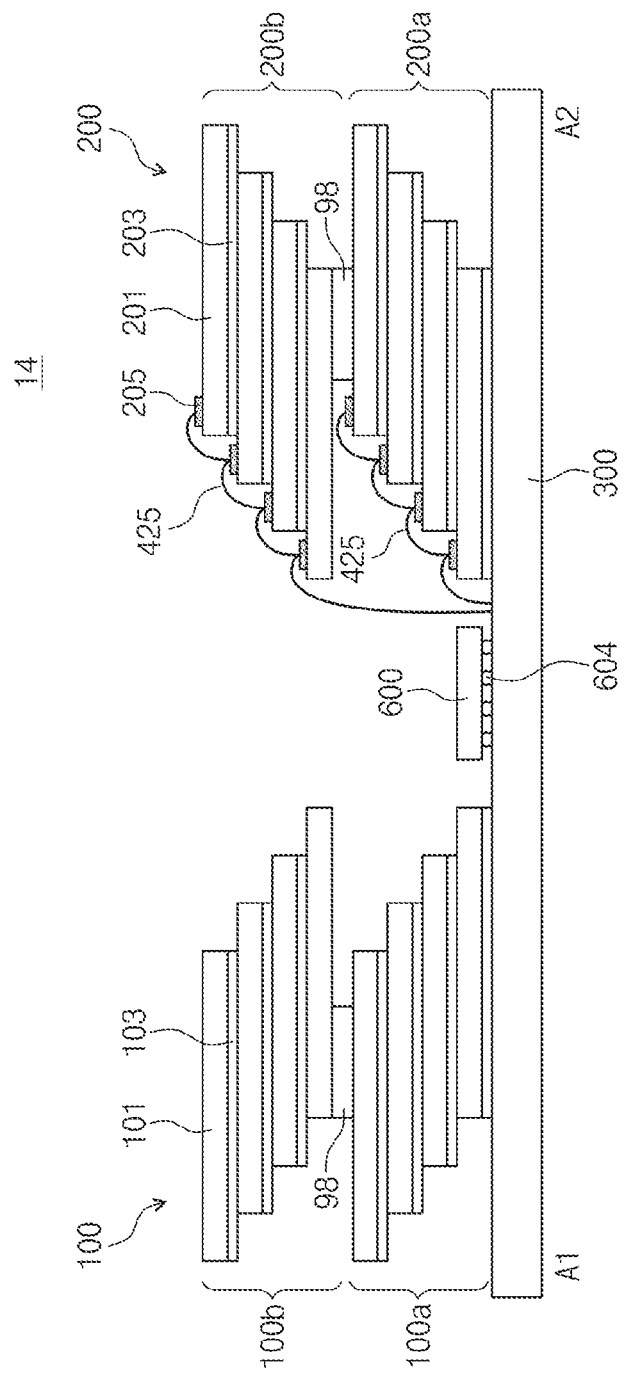
FIG. 4D is a sectional view illustrating a modification of the semiconductor package of FIG. 4B.
Figure 4E:
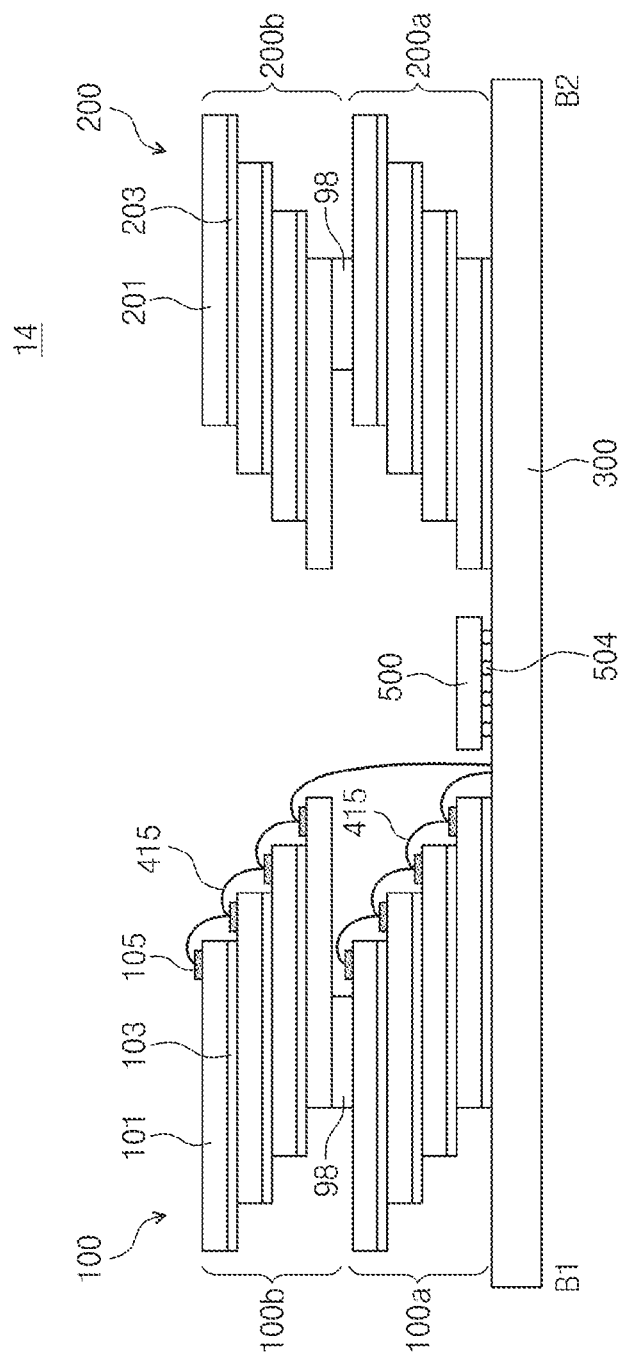
FIG. 4E is a sectional view illustrating a modification of the semiconductor package of FIG. 4C.

FIG. 4A is a perspective view illustrating a semiconductor package according to still other example embodiment of the inventive concept. FIG. 4B is a sectional view taken along line A1-A2 of FIG. 4A. FIG. 4C is a sectional view taken along line B1-B2 of FIG. 4A. FIG. 4D is a sectional view illustrating a modification of the semiconductor package of FIG. 4B. FIG. 4E is a sectional view illustrating a modification of the semiconductor package of FIG. 4C.

Referring to FIGS. 4A, 4B, and 4C, similar to the semiconductor package 12 of FIG. 2A, a semiconductor package 14 may include the first and second chip stacks 100 and 200 mounted on the package substrate 300. The first chip stack 100 may include the first lower and upper stacks 100a and 100b, each of which the first semiconductor chips 101 are stacked to form a staircase structure. The second chip stack 200 may include the second lower and upper stacks 200a and 200b, each of which the second semiconductor chips 201 are stacked to form a staircase structure.

Each of the first semiconductor chips 101 may have an edge pad structure. For example, each of the first semiconductor chips 101 may include the first functional bonding pads 105 that are locally provided on one edge region (e.g., right edge region) of the top surface thereof. The first functional bonding pads 105 may occupy half the area of the edge region of the top surface of the first semiconductor chip 101. In some embodiments, the first functional bonding pads 105 may not need to occupy half the area of the edge region of the top surface of the first semiconductor chip 101 or the second functional bonding pads 205 may not need to occupy half the area of the edge region of the top surface of the second semiconductor chip 201. The first functional bonding pads 105 or the second functional bonding pads 205 may only need to occupy a region that is substantially less than an entirety of the respective edge region. Each of second semiconductor chips 201 may have an edge pad structure. For example, each of the second semiconductor chips 201 may include the second functional bonding pads 205 that are locally provided on one edge region (e.g., left edge region) of the top surface thereof. The second functional bonding pads 205 may be provided to occupy half the area of the edge region of the top surface of the second semiconductor chip 201.

The first and second chip stacks 100 and 200 may be symmetrical to each other. For example, the first chip stack 100 may have a leftwardly-ascending staircase structure, and the second chip stack 200 may have a rightwardly-ascending staircase structure. The first functional bonding pads 105 of the first chip stack 100 may be disposed on a region along the line B1-B2, and the second functional bonding pads 205 of the second chip stack 200 may be disposed on another region along the line A1-A2. Due to the symmetric arrangement of the first and second chip stacks 100 and 200, the first functional bonding pads 105 of the first chip stack 100 may be positioned adjacent to an edge region of the second chip stack 200, which does not have any pads. Similarly, the second functional bonding pads 205 of the second chip stack 200 may be positioned adjacent to an edge region of the first chip stack 100, which does not have any pads.

The semiconductor package 14 may further include one or more third semiconductor chips such as a first controller 500 and a second controller 600 provided between the first and second chip stacks 100 and 200, arranged on, for example, the center region of the package substrate 300. The one or more third chips, e.g., the first controller 500 and the second controller 600, may be aligned with each other between the first and second chip stacks 100, 200. The one or more third chips may also be a dynamic random access memory (DRAM) chip or a telecommunication chip.

The first controller 500 may be mounted on a right side portion (e.g., adjacent to or disposed on the line B1-B2) of the center region of the package substrate 300 and may be electrically connected to the first chip stack 100. The second controller 600 may be mounted on a left side portion (e.g., adjacent to or disposed on the line A1-A2) of the center region of the package substrate 300 and may be electrically connected to the second chip stack 200.

The first and second controllers 500 and 600 may be electrically connected to the package substrate 300 using the wire bonding technology, as shown in FIGS. 4B and 4C.

The second controller 600 may be mounted on the center region of the package substrate 300 by an adhesive layer 603 and may be electrically connected to the package substrate 300 through bonding wires 615, as shown in FIG. 4B. The bonding wires 615 may be connected to the package substrate 300 through a gap region between the second controller 600 and the first chip stack 100. The second chip stack 200 may be electrically connected to the second controller 600 through the second bonding wires 425 connecting the second functional bonding pads 205 with the second controller 600.

As shown in FIG. 4C, the first controller 500 may be mounted on the center region of the package substrate 300 by an adhesive layer 503 and may be electrically connected to the package substrate 300 through bonding wires 515. The bonding wires 515 may be connected to the package substrate 300 through a gap region between the first controller 500 and the second chip stack 200. The first chip stack 100 may be electrically connected to the first controller 500 through the first bonding wires 415 connecting the first functional bonding pads 105 with the first controller 500.

As described above, the first chip stack 100 may be electrically connected to the package substrate 300 via the first controller 500, and the second chip stack 200 may be electrically connected to the package substrate 300 via the second controller 600. According to the present embodiment, since the first and second controllers 500 and 600 are disposed on the center region of the package substrate 300 between the first and second chip stacks 100 and 200, it is possible to reduce a size of the semiconductor package 14 and thereby use efficiently the area of the package substrate 300.

Alternatively, the first and second controllers 500 and 600 may be connected to the package substrate 300 in a flip-chip bonding manner, as shown in FIGS. 4D and 4E.

For example, as shown in FIG. 4D, the second controller 600 may be electrically connected to the package substrate 300 through solder balls 604 provided on the center region of the package substrate 300. The second chip stack 200 may be electrically connected to the second controller 600 through the second bonding wires 425 connecting the second functional bonding pads 205 with the package substrate 300.

As shown in FIG. 4E, the first controller 500 may be electrically connected to the package substrate 300 through solder balls 504 provided on the center region of the package substrate 300. The first chip stack 100 may be electrically connected to the first controller 500 through the first bonding wires 415 connecting the first functional bonding pads 105 with the package substrate 300.

In some embodiments, although not illustrated, bonding pads of the first semiconductor chip 101 or the second semiconductor chip 201 may be coupled to center pads (not shown) formed on a center region of the top surface of the first or second semiconductor chip 101, 201 via a redistribution line.

Yet Other Example Embodiments

Figure 5:
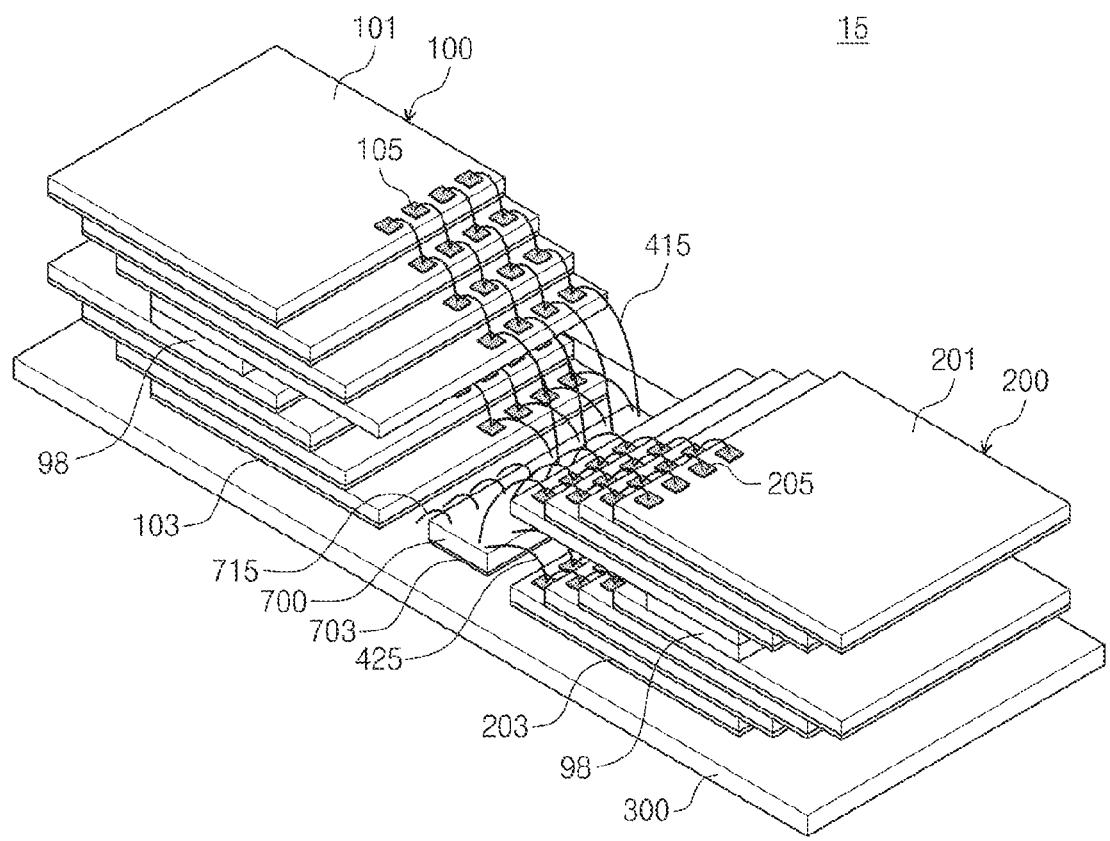
FIG. 5 is a perspective view illustrating a semiconductor package according to yet other example embodiment of the inventive concept.

FIG. 5 is a perspective view illustrating a semiconductor package according to yet other example embodiment of the inventive concept.

Referring to FIG. 5, a semiconductor package 15 may be configured to have a similar structure as that of the semiconductor package 14 of FIG. 4A. Unlike the semiconductor package 14, the semiconductor package 15 may include a common controller 700 on the center region of the package substrate 300 and between the first and second chip stacks 100 and 200. The common controller 700 may be mounted on the center region of the package substrate 300 by an adhesive layer 703 and may be electrically connected to the package substrate 300 through bonding wires 715. Alternatively, the common controller 700 may be connected to the package substrate 300 in the flip-chip bonding manner, like that shown in FIGS. 4D and 4E.

The common controller 700 may be electrically connected to the first chip stack 100 and the second chip stack 200. For example, the first chip stack 100 may be electrically connected to the common controller 700 through the first bonding wires 415 connecting the first functional bonding pads 105 with the common controller 700. The second chip stack 200 may be electrically connected to the common controller 700 through the second bonding wires 425 connecting the second functional bonding pads 205 with the common controller 700.

Further Example Embodiments

Figure 6A:
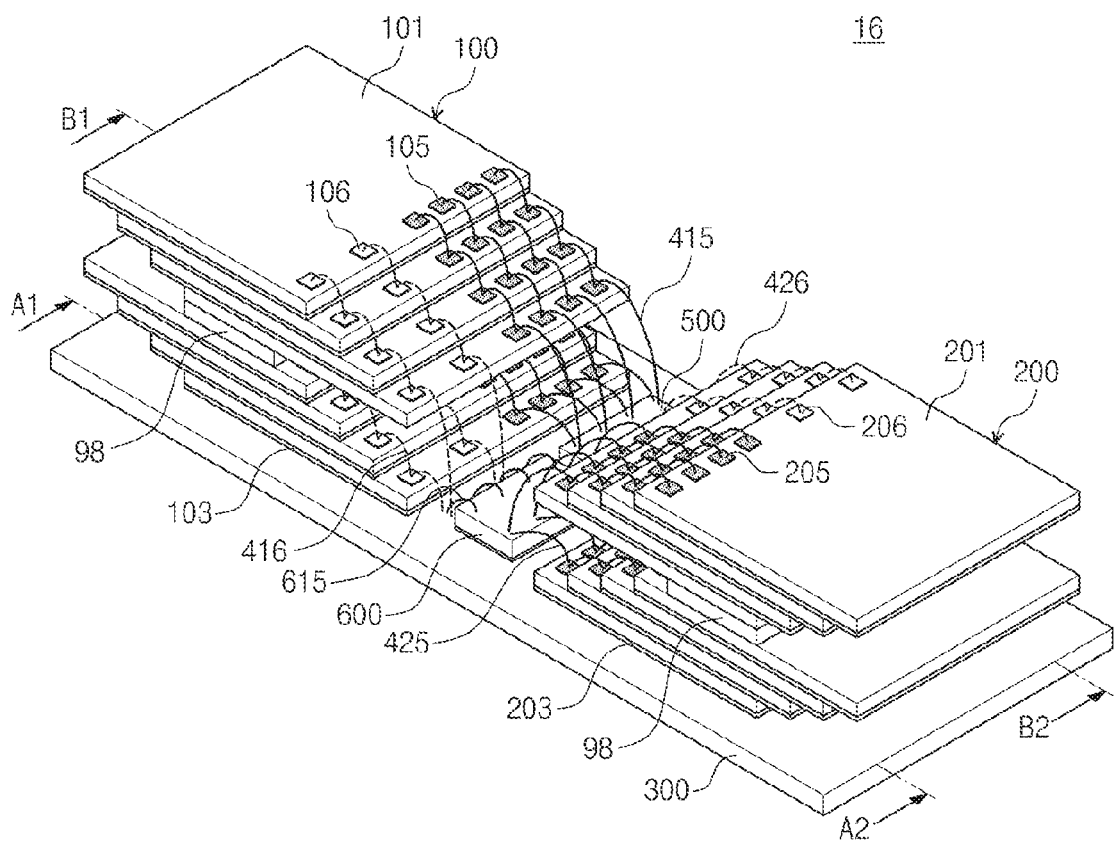
FIG. 6A is a perspective view illustrating a semiconductor package according to further example embodiment of the inventive concept.
Figure 6B:
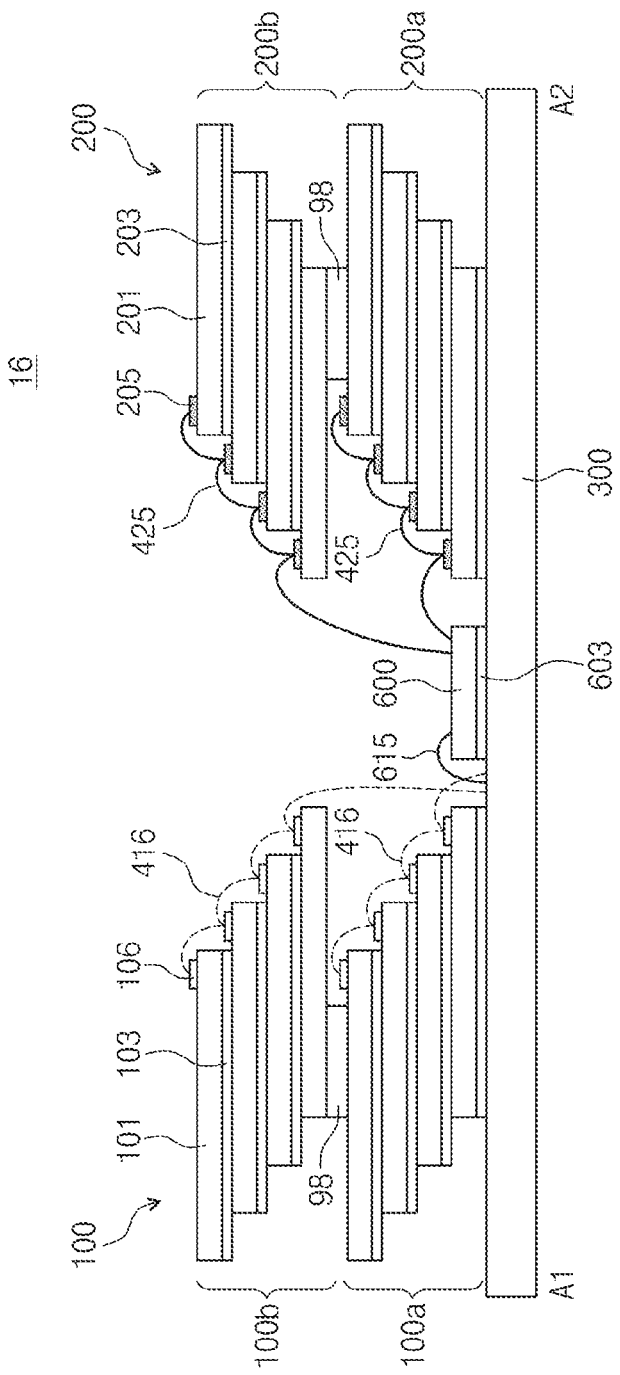
FIG. 6B is a sectional view taken along a line A1-A2 of FIG. 6A.
Figure 6D:
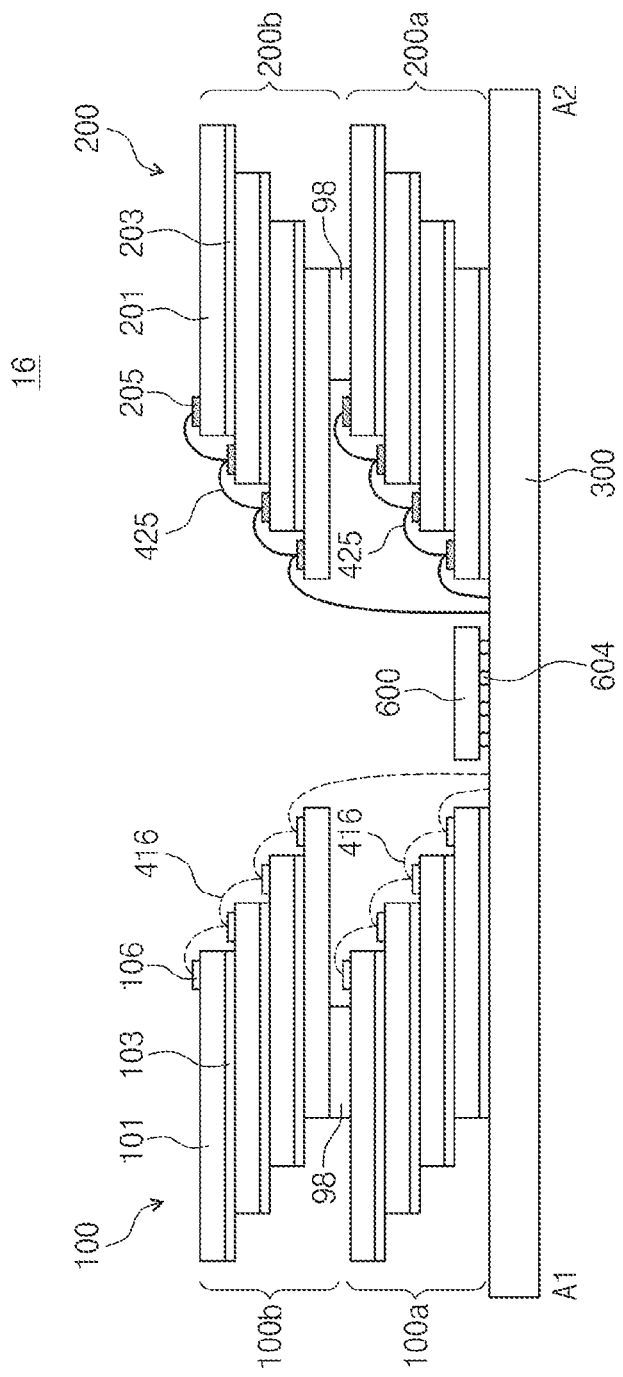
FIG. 6D is a sectional view illustrating a modification of the semiconductor package of FIG. 6B.

FIG. 6A is a perspective view illustrating a semiconductor package according to further example embodiment of the inventive concept. FIG. 6B is a sectional view taken along a line A1-A2 of FIG. 6A. FIG. 6C is a sectional view taken along a line B1-B2 of FIG. 6A. FIG. 6D is a sectional view illustrating a modification of the semiconductor package of FIG. 6B. FIG. 6E is a sectional view illustrating a modification of the semiconductor package of FIG. 6C.

Referring to FIGS. 6A, 6B, and 6C, similar to the semiconductor package 13 of FIG. 3A, a semiconductor package 16 may include the first and second chip stacks 100 and 200 mounted on the package substrate 300. The first chip stack 100 may include the first lower and upper stacks 100a and 100b, each of which the first semiconductor chips 101 are stacked to form a staircase structure. The second chip stack 200 may include the second lower and upper stacks 200a and 200b, each of which the second semiconductor chips 201 are stacked to form a staircase structure.

Each of the first semiconductor chips 101 may be provided to have an edge pad structure; for example, each of the first semiconductor chips 101 may include the first functional bonding pads 105 and the first auxiliary pads 106 that are provided on one edge region (e.g., right edge region) of the top surface thereof. The first functional bonding pads 105 may be provided to occupy, for example, half an area of the edge region of the top surface of the first semiconductor chip 101, and the first auxiliary pads 106 may be provided to occupy the remaining area of the edge region of the top surface of the first semiconductor chip 101. Each of the second semiconductor chips 201 may be provided to have the edge pad structure; for example, each of the second semiconductor chips 201 may include the second functional bonding pads 205 and the second auxiliary pads 206 that are locally provided on one edge region (e.g., left edge region) of the top surface thereof. The second functional bonding pads 205 may be provided to occupy half an area of the edge region of the top surface of the second semiconductor chip 201, and the second auxiliary pads 206 may be provided to occupy the remaining area of the edge region of the top surface of the second semiconductor chip 201.

The first and second chip stacks 100 and 200 may be symmetrical to each other. For example, the first chip stack 100 may have the leftwardly-ascending staircase structure, while the second chip stack 200 may have the rightwardly-ascending staircase structure. The first functional bonding pads 105 of the first chip stack 100 may be disposed on a region adjacent to or along the line B1-B2, and the first auxiliary pads 106 may be disposed on another region adjacent to or along the line A1-A2. The second functional bonding pads 205 of the second chip stack 200 may be disposed on the another region adjacent to or along the line A1-A2, and the second auxiliary pads 206 may be disposed on the region adjacent to or along the line B1-B2. Accordingly, the first functional bonding pads 105 may be disposed adjacent to the second auxiliary pads 206, and the second functional bonding pads 205 may be disposed adjacent to the first auxiliary pads 106.

The semiconductor package 16 may further include the first controller 500 and the second controller 600 provided on the center region of the package substrate 300 and between the first and second chip stacks 100 and 200. The first controller 500 may be mounted on a right side portion (e.g., adjacent to or disposed on the line B1-B2) of the center region of the package substrate 300 and may be electrically connected to the first chip stack 100. The second controller 600 may be mounted on a left side portion (e.g., adjacent to or disposed on the line A1-A2) of the center region of the package substrate 300 and may be electrically connected to the second chip stack 200.

The first and second controllers 500 and 600 may be electrically connected to the package substrate 300 using the wire bonding technology, as shown in FIGS. 6B and 6C.

The second controller 600 may be mounted on the center region of the package substrate 300 by the adhesive layer 603 and may be electrically connected to the package substrate 300 through the bonding wires 615, as shown in FIG. 6B. The bonding wires 615 may be connected to the package substrate 300 through the gap region between the second controller 600 and the first chip stack 100. The second chip stack 200 may be electrically connected to the second controller 600 through the second bonding wires 425 connecting the second functional bonding pads 205 with the second controller 600. The second auxiliary wires 426 coupled to the second auxiliary pads 206 may be connected to the package substrate 300 between the second chip stack 200 and the first controller 500, as shown in FIG. 6C.

As shown in FIG. 6C, the first controller 500 may be mounted on the center region of the package substrate 300 by the adhesive layer 503 and may be electrically connected to the package substrate 300 through the bonding wires 515. The bonding wires 515 may be connected to the package substrate 300 between the first controller 500 and the second chip stack 200. The first chip stack 100 may be electrically connected to the first controller 500 through the first bonding wires 415 connecting the first functional bonding pads 105 with the first controller 500. The first auxiliary bonding wires 416 coupled to the first auxiliary pads 106 may be connected to the package substrate 300 between the first chip stack 100 and the second controller 600, as shown in FIG. 6B.

Alternatively, the first and second controllers 500 and 600 may be connected to the package substrate 300 in the flip-chip bonding manner, as shown in FIGS. 6D and 6E.

For example, as shown in FIG. 6D, the second controller 600 may be electrically connected to the package substrate 300 through solder balls 604 provided on the center region of the package substrate 300. The second chip stack 200 may be electrically connected to the second controller 600 through the second bonding wires 425 connecting the second functional bonding pads 205 with the package substrate 300, as illustrated in FIG. 6D, and through the second auxiliary bonding wires 426 connecting the second auxiliary pads 206 with the package substrate 300, as illustrated in FIG. 6E.

As shown in FIG. 6E, the first controller 500 may be electrically connected to the package substrate 300 through the solder balls 504 provided on the center region of the package substrate 300. The first chip stack 100 may be electrically connected to the first controller 500 through the first bonding wires 415 connecting the first functional bonding pads 105 with the package substrate 300, as illustrated in FIG. 6E, and through the first auxiliary bonding wires 416 connecting the first auxiliary pads 106 with the package substrate 300, as illustrated in FIG. 6D.

Still Further Example Embodiments

Figure 7:
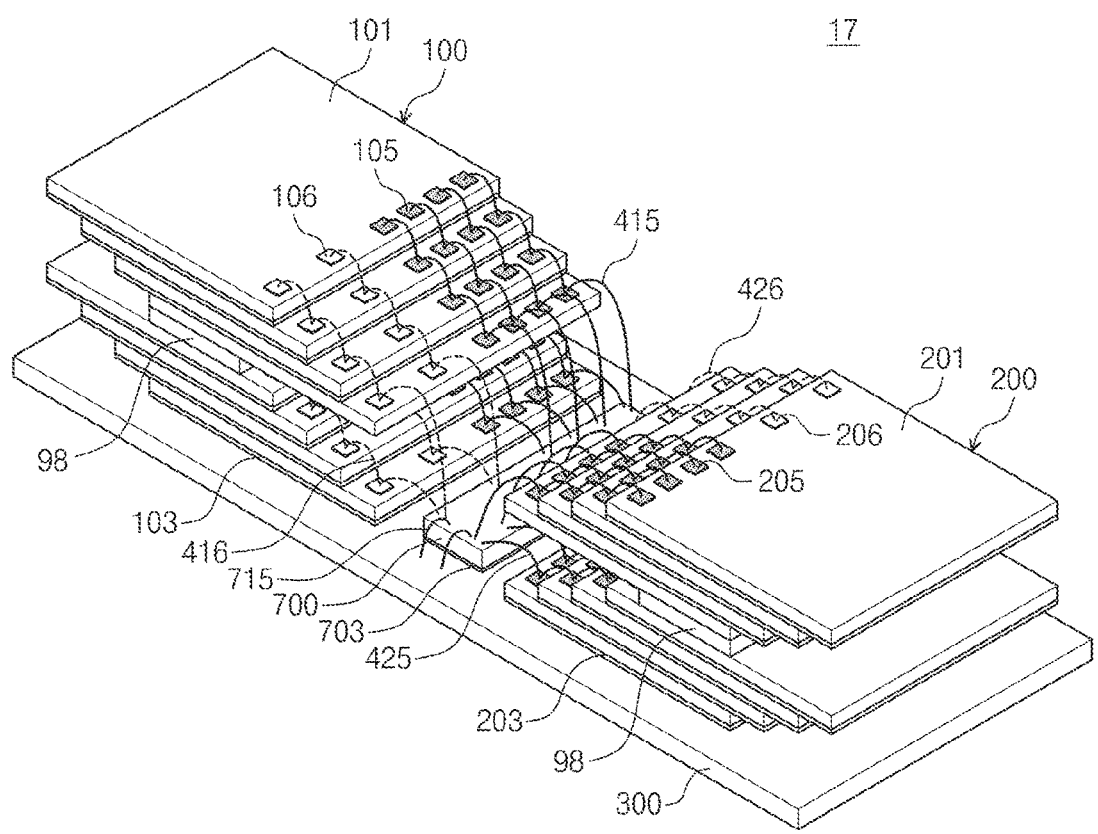
FIG. 7 is a perspective view illustrating a semiconductor package according to still further example embodiment of the inventive concept.

FIG. 7 is a perspective view illustrating a semiconductor package according to still further example embodiment of the inventive concept.

Referring to FIG. 7, a semiconductor package 17 may be configured to have a similar structure as that of the semiconductor package 16 of FIG. 6A. Unlike the semiconductor package 16, the semiconductor package 17 may include the common controller 700 on the center region of the package substrate 300 and between the first and second chip stacks 100 and 200. The common controller 700 may be mounted on the center region of the package substrate 300 by the adhesive layer 703 and may be electrically connected to the package substrate 300 through the bonding wires 715. Alternatively, the common controller 700 may be connected to the package substrate 300 in the flip-chip bonding manner, like that shown in FIGS. 6D and 6E.

The common controller 700 may be electrically connected to the first chip stack 100 and the second chip stack 200. For example, the first chip stack 100 may be electrically connected to the common controller 700 through first bonding wires 415 connecting the first functional bonding pads 105 with the common controller 700 and through first auxiliary bonding wires 416, which connect the first auxiliary pads 106 with the common controller 700. The second chip stack 200 may be electrically connected to the common controller 700 through second bonding wires 425 that connect the second functional bonding pads 205 with the common controller 700, and through second auxiliary bonding wires 426 that connect the second auxiliary pads 206 with the common controller 700.

Applications

Figure 8A:
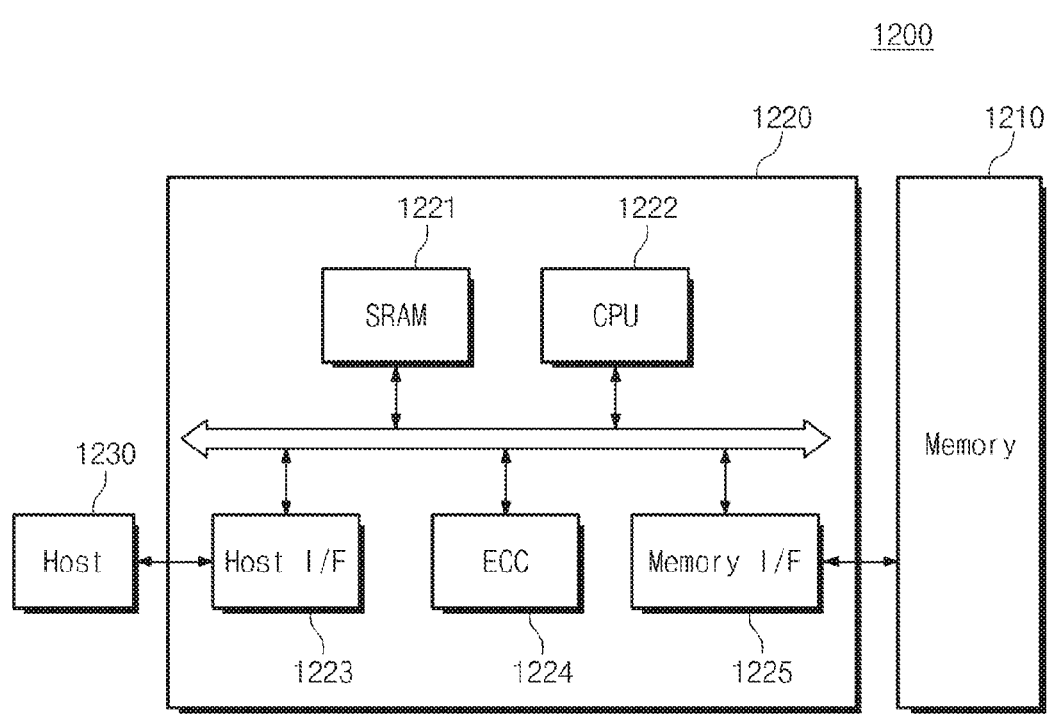
FIG. 8A is a block diagram illustrating a memory card including the semiconductor packages according to example embodiments of the inventive concept.
Figure 8B:
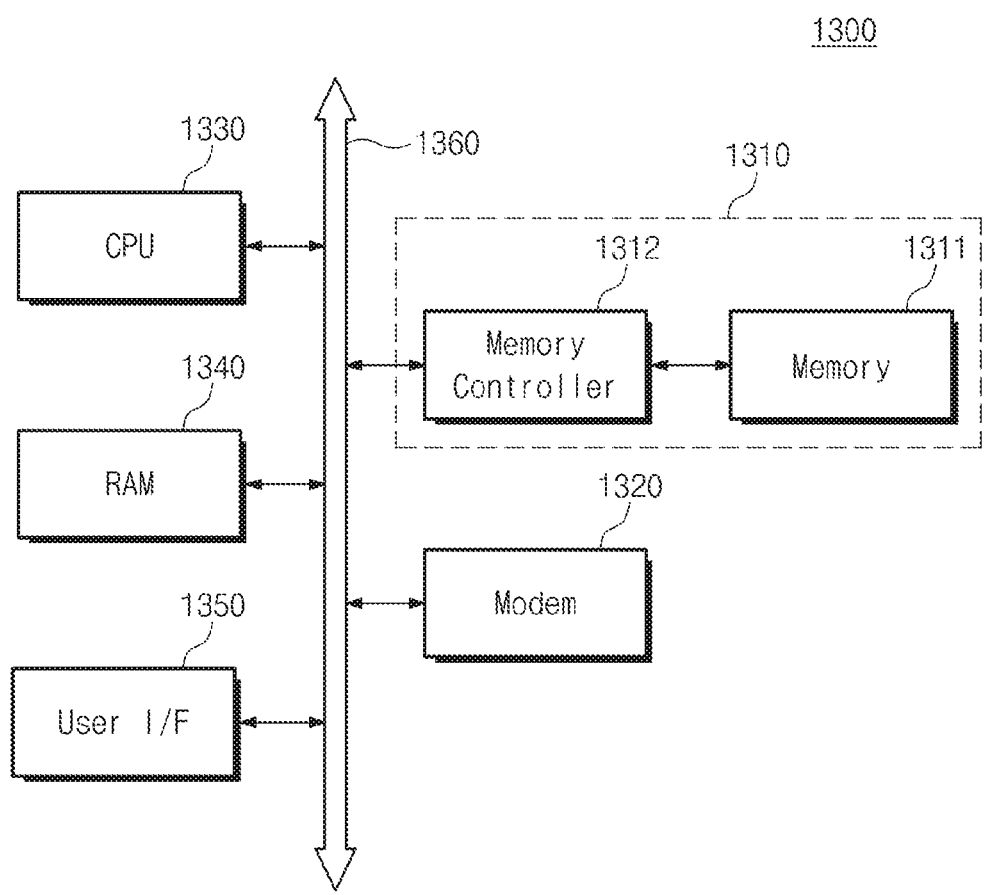
FIG. 8B is a block diagram illustrating an example of information processing systems including a semiconductor package according to example embodiments of the inventive concept.

FIG. 8A is a block diagram illustrating a memory card including the semiconductor packages according to example embodiments of the inventive concept. FIG. 8B is a block diagram illustrating an example of information processing systems including a semiconductor package according to example embodiments of the inventive concept.

Referring to FIG. 8A, a memory card 1200 may include a host 1230, a memory device 1210, and a memory controller 1220 controlling data exchanges therebetween. A static random access memory (SRAM) 1221 may be used as an operating memory of a processing unit 1222. A host interface 1223 may include a data exchange protocol of a host connected to a memory card 1200. An error correction block 1224 may be configured to detect and correct errors included in data read from a memory device 1210. A memory interface 1225 may be configured to interface with the memory device 1210. The processing unit 1222 may perform general control operations for data exchange of the memory controller 1220. The memory device 1210 may include at least one of the semiconductor packages 11-18 according to example embodiments of the inventive concept. Further, the processing unit 1222 may include at least one of the semiconductor packages 11-18 according to example embodiments of the inventive concept.

Referring to FIG. 8B, an information processing system 1300 may be realized using a memory system 1310 including at least one of the semiconductor packages 11-18 according to example embodiments of the inventive concept. For instance, the information processing system 1300 may be a mobile device and/or a computer. In example embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312, and in some embodiments, the memory system 1310 may be configured substantially identical to the memory card 1200 described with respect to FIG. 8A. The CPU 1330 and the RAM 1340 may include at least one of the semiconductor packages 11-18 according to example embodiments of the inventive concept.

Data processed by the CPU 1330 and/or input from the outside may be stored in the memory system 1310. In certain embodiments, the information processing system 1300 may further include or be, for example, an application chipset, a camera image sensor, a camera image signal processor (ISP), an input/output device, or the like. For example, the memory system 1310 may be provided in the form of the semiconductor disk device (SSD), and in this case, the information processing system 1300 may stably and reliably store a large amount of data in the memory system 1310.

Throughout the specification, features shown in one embodiment may be incorporated in other embodiments within the spirit and scope of the inventive concept.

According to example embodiments of the inventive concept, a semiconductor package may include a semiconductor chip, in which pads are arranged to allow for a reduction in volume of the semiconductor package and consequently of semiconductor products. Further, it is possible to reduce an area occupied by the semiconductor chips in the semiconductor package and perform a wire bonding process effectively, and thus, the semiconductor package can be fabricated with increased yield.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
    a first chip stack and a second chip stack mounted side by side on a package substrate and each connected to the package substrate in a wire bonding manner,
    wherein the first chip stack comprises a plurality of first semiconductor chips that are stepwise stacked on the package substrate to have a descending staircase structure toward the second chip stack,
    wherein the second chip stack comprises a plurality of second semiconductor chips that are stepwise stacked on the package substrate to have a descending staircase structure toward the first chip stack,
    wherein the first semiconductor chips comprises first pads on first edge regions and second edge regions of top surfaces thereof, respectively,
    wherein a pitch of the first pads on the first edge regions is greater than that of the first pads on the second edge regions,
    wherein the second semiconductor chips comprising second pads on first edge regions and on second edge regions of top surfaces thereof, respectively,
    wherein a pitch of the second pads in the second edge regions is greater than that of the second pads in first edge regions,
    wherein the first edge regions of the first semiconductor chips face the first edge regions of the second semiconductor chips in a first direction,
    wherein the second edge regions of the first semiconductor chips face the second edge regions of the second semiconductor chips in a second direction crossing the first direction,
    wherein the first edge regions of the top surfaces of the first semiconductor chips overlap with a first virtual line in a plan view,
    wherein the second edge regions of the top surfaces of the first semiconductor chips overlap with a second virtual line in a plan view, and
    wherein the second virtual line is offset from the first virtual line.

2. The package of claim 1,
    wherein the top surfaces of the first semiconductor chips further comprises third regions, and
    wherein the first pads are not provided on the third regions of the top surfaces of the first semiconductor chips.

3. The package of claim 1, further comprising a third chip disposed on the package substrate between the first chip stack and the second chip stack.

4. The package of claim 3, further comprising;
    first bonding wires connected to one of the first pads and the package substrate; and
    second bonding wires connected between the third chip and the package substrate.

5. The package of claim 1,
    wherein the first pads are electrically connected to integrated circuits of the first semiconductor chips.

6. A semiconductor package, comprising:
    a package substrate; and
    a first chip stack and a second chip stack mounted side by side on the package substrate and connected to the package substrate via bonding wires, the first chip stack comprises an edge and the second chip stack comprises an edge, the edge of the first chip stack faces the edge of the second chip stack,
    wherein the first and second chip stacks include a plurality of semiconductor chips stacked on the package substrate, respectively, the first and second chip stacks have staircase structures that extend away from the edge of the second chip stack and away from the edge of the first chip stack, respectively,
    wherein the semiconductor chips include bonding pad groups on first regions of top surfaces thereof and auxiliary pad groups on second regions of the top surfaces thereof, respectively,
    wherein each of the bonding pad groups includes bonding pads,
    wherein each of the auxiliary pad groups includes auxiliary pads,
    wherein pitch of the auxiliary pads is greater than that of the bonding pads,
    wherein the bonding pad groups of the first chip stack face the bonding pad groups of the second chip stack in a first direction, and
    wherein the auxiliary pad groups of the first chip stack face the auxiliary pad groups of the second chip stack in a second direction crossing the first direction.

7. The semiconductor package of claim 6,
    wherein the top surfaces of the semiconductor chips further comprising third regions, wherein no pad is provided on the third regions of top surfaces of the semiconductor chips.

8. The semiconductor package of claim 6,
    wherein the bonding pad groups of the semiconductor chips of the first chip stack are aligned with a first virtual line in a plan view, wherein the bonding pad groups of the semiconductor chips of the second chip stack are aligned with a second virtual line in a plan view.

9. The semiconductor package of claim 8, wherein first virtual line and the second virtual line are substantially parallel to each other.

10. The semiconductor package of claim 8, wherein the auxiliary pad groups of the semiconductor chips of the first chip stack are aligned with the second virtual line in a plan view.

11. The semiconductor package of claim 8, wherein the auxiliary pad groups of the semiconductor chips of the second chip stack are aligned with the first virtual line in a plan view.

12. The semiconductor package of claim 6, further comprising one or more third semiconductor chips mounted on the package substrate between the first chip stack and the second chip stack to be electrically coupled to at least one of the first and second chip stacks.

13. The semiconductor package of claim 12, further comprising substrate bonding wires connected between one of the one or more third semiconductor chips and the package substrate.

14. The semiconductor package of claim 6, wherein the bonding pads and the auxiliary pads are electrically connected to integrated circuits of the semiconductor chips.

\* \* \* \* \*